(12) United States Patent
Maejima

(10) Patent No.: US 9,361,998 B2
(45) Date of Patent: Jun. 7, 2016

(54) SEMICONDUCTOR MEMORY DEVICE AND DATA WRITING METHOD OF THE SAME

(71) Applicant: KABUSHIKI KAISHA TOSHIBA, Tokyo (JP)

(72) Inventor: Hiroshi Maejima, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 128 days.

(21) Appl. No.: 14/015,985

(22) Filed: Aug. 30, 2013

(65) Prior Publication Data

US 2014/0254270 A1     Sep. 11, 2014

(30) Foreign Application Priority Data

Mar. 6, 2013  (JP) .................. 2013-044206

(51) Int. Cl.
 G11C 16/34  (2006.01)
 G11C 8/08  (2006.01)
 G11C 16/08  (2006.01)

(52) U.S. Cl.
 CPC .............. G11C 16/3459 (2013.01); G11C 8/08 (2013.01); G11C 16/08 (2013.01)

(58) Field of Classification Search
 CPC ....... G11C 16/08; G11C 8/08; G11C 16/3459
 See application file for complete search history.

(56) References Cited

U.S. PATENT DOCUMENTS

| 7,023,735 | B2 | 4/2006 | Ban et al. | |
| 7,492,641 | B2 * | 2/2009 | Hosono .................. | G11C 16/12 365/185.21 |
| 7,518,909 | B2 | 4/2009 | Park et al. | |
| 2002/0036923 | A1 * | 3/2002 | Chung et al. ............. | 365/185.13 |
| 2004/0240269 | A1 * | 12/2004 | Cernea ..................... | G11C 8/08 365/185.12 |
| 2006/0227624 | A1 * | 10/2006 | Shiga ................. | G11C 11/5628 365/210.12 |
| 2006/0291290 | A1 * | 12/2006 | Kim ...................... | G11C 16/12 365/185.22 |
| 2009/0040836 | A1 * | 2/2009 | Lee .......................... | 365/185.22 |
| 2010/0037007 | A1 | 2/2010 | Futatsuyama et al. | |
| 2013/0028021 | A1 * | 1/2013 | Sharon et al. ............ | 365/185.17 |
| 2014/0286099 | A1 * | 9/2014 | Shirakawa ............. | G11C 16/26 365/185.12 |
| 2015/0154069 | A1 * | 6/2015 | Tuers .................. | G06F 11/1072 714/773 |

FOREIGN PATENT DOCUMENTS

JP    2010-040109 A    2/2010
TW    I303826 B    12/2008

OTHER PUBLICATIONS

Taiwan Office Action in counterpart Taiwan Application 102128727 with English Translation.
Taiwan Office Action dated Jan. 29, 2016 in counterpart Taiwan Patent Application 102128727 with English Translation.

* cited by examiner

*Primary Examiner* — Khamdan Alrobaie
(74) *Attorney, Agent, or Firm* — Patterson & Sheridan, LLP

(57) ABSTRACT

A semiconductor memory device includes memory cells which are laminated on a semiconductor substrate and include charge storage layers and control gates, a plurality of word lines each of which is commonly connected to the control gates of a plurality of the memory cells, and a control unit which performs programming and verification of data in units of a page of memory cells. The control unit consecutively performs programming of data in two or more pages of memory cells connected to the same word line, and then consecutively performs verification of the data programmed in the two or more pages of memory cells connected to the same word line.

19 Claims, 23 Drawing Sheets

US 9,361,998 B2

SEMICONDUCTOR MEMORY DEVICE AND DATA WRITING METHOD OF THE SAME

CROSS-REFERENCE TO RELATED APPLICATION

This application is based upon and claims the benefit of priority from Japanese Patent Application No. 2013-044206, filed Mar. 6, 2013, the entire contents of which are incorporated herein by reference.

FIELD

Embodiments described herein relate generally to a semiconductor memory device and a data writing method of the same.

BACKGROUND

A NAND-type flash memory in which memory cells are arranged three-dimensionally is known in the art.

DETAILED DESCRIPTION

Figure 1:
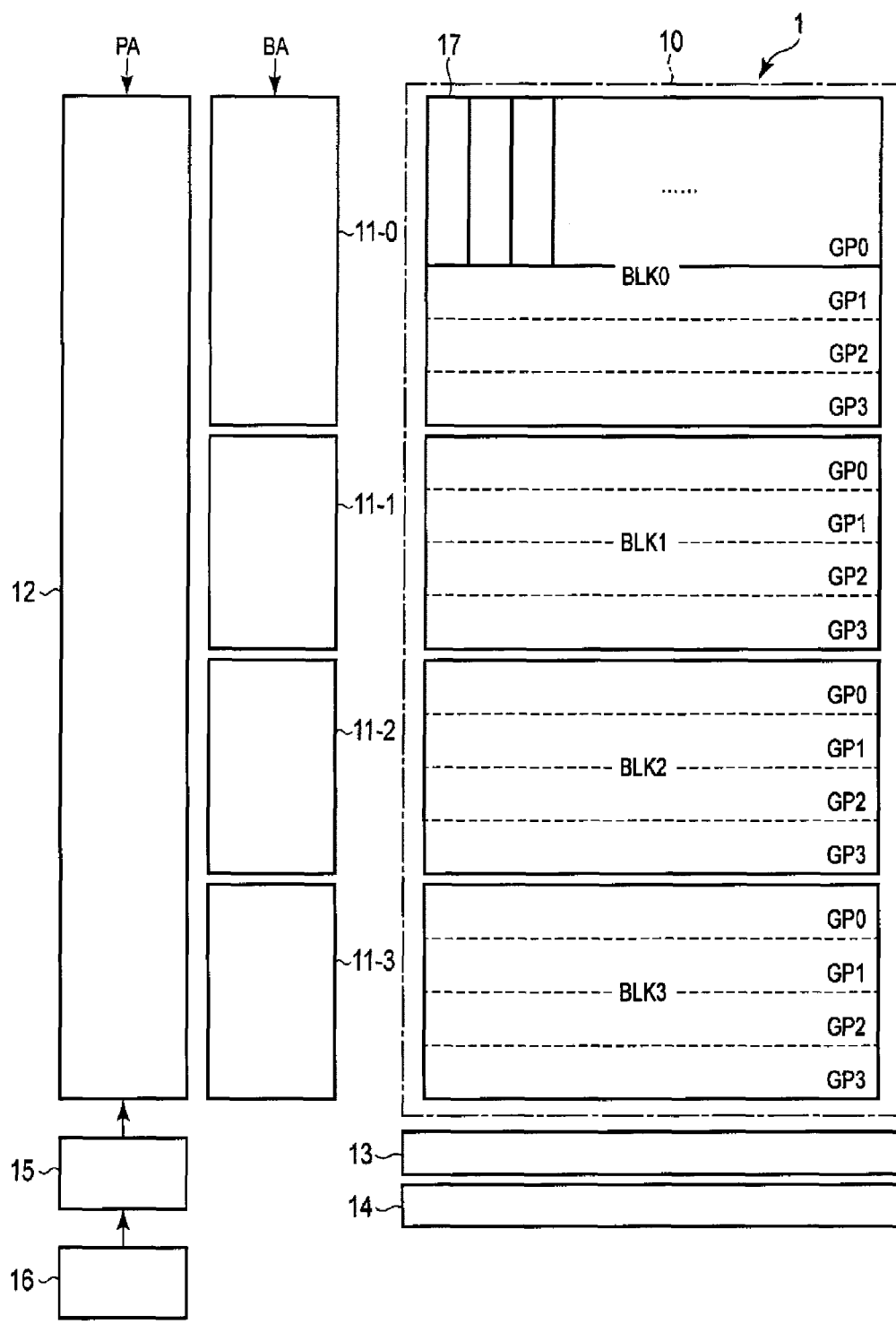
FIG. 1 is a block diagram of a semiconductor memory device according to a first embodiment.

Embodiments provide a semiconductor memory device which can enhance an operating speed and a data writing method thereof.

In general, according to one embodiment, a semiconductor memory device comprises a plurality of memory cells which are laminated above a semiconductor substrate and include charge storage layers and control gates; a plurality of word lines each of which is commonly connected to control gates of a plurality of memory cells; and a control unit configured to perform programming and verification of data in the memory cells. The control unit is configured to consecutively perform programming of data in at least two pages of the memory cells connected to the same word line, and then consecutively perform verification of data in said at least two pages of the memory cells connected to the same word line.

Hereinafter, embodiments will be described referring to the drawings. In this description, the common reference numerals are used to refer to common portions across all drawings.

1. First Embodiment

A semiconductor memory device according to a first embodiment will be described. Hereinafter, the semiconductor memory device will be described with a three-dimensional NAND-type flash memory in which memory cells are laminated above a semiconductor substrate, as an example.

1.1 Configuration of Semiconductor Memory Device

First, a configuration of the semiconductor memory device according to the embodiment will be described.

1.1.1 Overall Configuration of Semiconductor Memory Device

FIG. 1 is a block diagram of a semiconductor memory device according to a first embodiment. As shown in the drawing, a NAND-type flash memory 1 includes a memory cell array 10, row decoders 11 (11-0 to 11-3), a driver circuit 12, a sense amplifier 13, a data latch 14, a voltage generation circuit 15, and a control circuit 16.

The memory cell array 10 includes a plurality (four in this example) of blocks BLK (BLK0 to BLK3) which are each a grouping of nonvolatile memory cells. Data in the same block BLK are collectively erased, for example. Each of the blocks BLK includes a plurality (four in this example) of memory groups GP (GP0 to GP3) which are each a grouping of NAND strings 17 in which memory cells are connected in series. Of course, the number of blocks in the memory cell array 10 and the number of the memory groups in the block BLK are arbitrary. It is not necessary that data in the same block BLK be erased as a unit. For example, data in the same memory group GP may be erased as a unit.

The row decoders 11-0 to 11-3 are provided corresponding to the blocks BLK0 to BLK3, respectively. The row direction of the corresponding block BLK is selected.

The driver circuit 12 supplies voltage necessary for writing, reading-out, and erasing of data to the row decoders 11. This voltage is applied to the memory cells by the row decoders 11.

The sense amplifier 13 senses and amplifies the data read out from the memory cells when reading out the data. In addition, when writing the data, the data to be written is transmitted to the memory cells.

When reading out the data, the data latch 14 temporally holds the sensed and amplified data in the sense amplifier 13, and transmits this data to an external controller or host device through an input and output circuit (not shown). In addition, when writing the data, the data latch temporally holds the data to be written from the controller or the host device through the input and output circuit and transmits this to the sense amplifier 13.

The voltage generation circuit 15 generates voltage necessary for writing, reading-out, and erasing the data, and supplies this to the driver circuit 12.

The control circuit 16 controls the entire operations of the NAND-type flash memory.

1.1.2 Memory Cell Array 10

Figure 2:
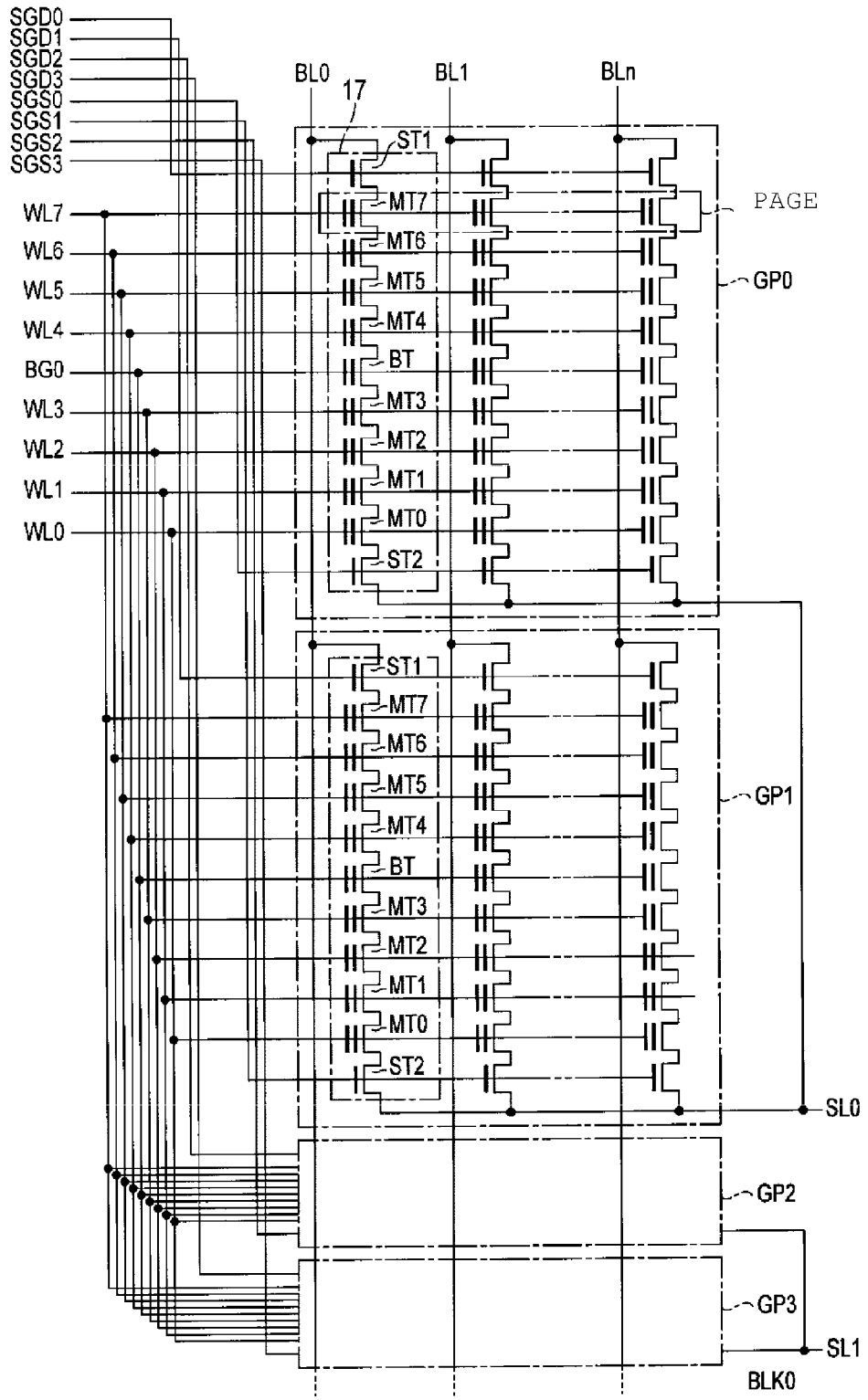
FIG. 2 is a circuit diagram of a memory cell array according to a first embodiment.

Next, the configuration of the memory cell array 10 will be described in detail. FIG. 2 is a circuit diagram of the block BLK0. The blocks BLK1 to BLK3 have the same configurations.

As shown in the drawing, the block BLK0 includes four memory groups GP. In addition, each of the memory groups GP includes n (n is a natural number) NAND strings 17.

Each of the NAND strings 17 includes, for example, eight memory cell transistors MT (MT0 to MT7), selection transistors ST1 and ST2, and a back gate transistor BT. Each of the memory cell transistors MT includes a laminated gate including a control gate and a charge storage layer, and holds the data in a nonvolatile state. In addition, the number of the memory cell transistors MT is not limited to eight, may be 16, 32, 64, 128, or the like, and the number thereof is not limited. The back gate transistor BT also includes a laminated gate including a control gate and a charge storage layer, in the same manner as the memory cell transistors MT. However, the back gate transistor BT is not for holding the data, and simply functions as a current path when writing and erasing the data. The memory cell transistors MT and the back gate transistor BT are disposed between the selection transistors ST1 and ST2 so that the current paths thereof are connected to each other in series. In addition, the back gate transistor BT is provided between the memory cell transistors MT3 and MT4. The current path of the memory cell transistor MT7 which is one end side of this series connection is connected to one end of the current path of the selection transistor ST1, and the current path of the memory cell transistor MT0 which is the other end side is connected to one end of the current path of the selection transistor ST2.

The gates of the selection transistors ST1 of the respective memory groups GP0 to GP3 are commonly connected to selection gate lines SGD0 to SGD3, respectively, and the gates of the selection transistors ST2 are commonly connected to selection gate lines SGS0 to SGS3, respectively. The control gates of the memory cell transistors MT0 to MT7 in the same block BLK0 are commonly connected to word lines WL0 to WL7, respectively, and the control gate of the back gate transistor BT is commonly connected to a back gate line BG (in the blocks BLK0 to BLK3, BG0 to BG3, respectively).

That is, the word lines WL0 to WL7 and the back gate line BG are commonly connected to the plurality of memory groups GP0 to GP3 in the same block BLK0, whereas the selection gate lines SGD and SGS are independent for each of memory groups GP0 to GP3 even in the same block BLK0.

In addition, among the NAND strings 17 that are disposed in a matrix configuration in the memory cell array 10, the other end of the current path of the selection transistor ST1 of the NAND string 17 which is in the same row is commonly connected to one of bit lines BL (BL0 to BLn, herein n is a natural number). That is, the bit lines BL connect the NAND strings 17 between the plurality of blocks BLK. In addition, the other ends of the current paths of the selection transistors ST2 are commonly connected to source lines SL. The source lines SL commonly connect the NAND strings 17 between the plurality of memory groups GP, for example. In the example of FIG. 2, one source line SL is shared for two memory groups.

As described above, data items of the memory cell transistors MT in the same block BLK are collectively erased. In addition, the reading-out and writing of the data are collectively performed in the plurality of memory cell transistors MT commonly connected to any of word lines WL in any of memory groups GP of any of the blocks BLK. This unit is called a "page".

In the memory cell array 10 of the configuration described above, the memory cell transistors MT, the selection transistors ST1 and ST2, and the back gate transistor BT are three-dimensionally laminated on the upper portion of a semiconductor substrate. As an example, a part of a peripheral circuit such as the sense amplifier 13 is formed on the semiconductor substrate, for example, and the memory cell array 10 is formed on the upper portion of this peripheral circuit.

The configuration of the memory cell array 10 is disclosed in U.S. patent application Ser. No. 12/407,403 filed 19 Mar. 2009 and entitled "three dimensional stacked nonvolatile semiconductor memory". In addition, the configuration thereof is disclosed in U.S. patent application Ser. No. 12/406,524 filed 18 Mar. 2009 and entitled "three dimensional stacked nonvolatile semiconductor memory", in U.S. patent application Ser. No. 13/816,799 filed 22 Sep. 2011 and entitled "nonvolatile semiconductor memory device", and in U.S. patent application Ser. No. 12/532,030 filed 23 Mar. 2009 and entitled "semiconductor memory and method for manufacturing the same". The entire descriptions of these patent applications are incorporated by reference herein.

1.1.3 Row Decoders 11

Figure 3:
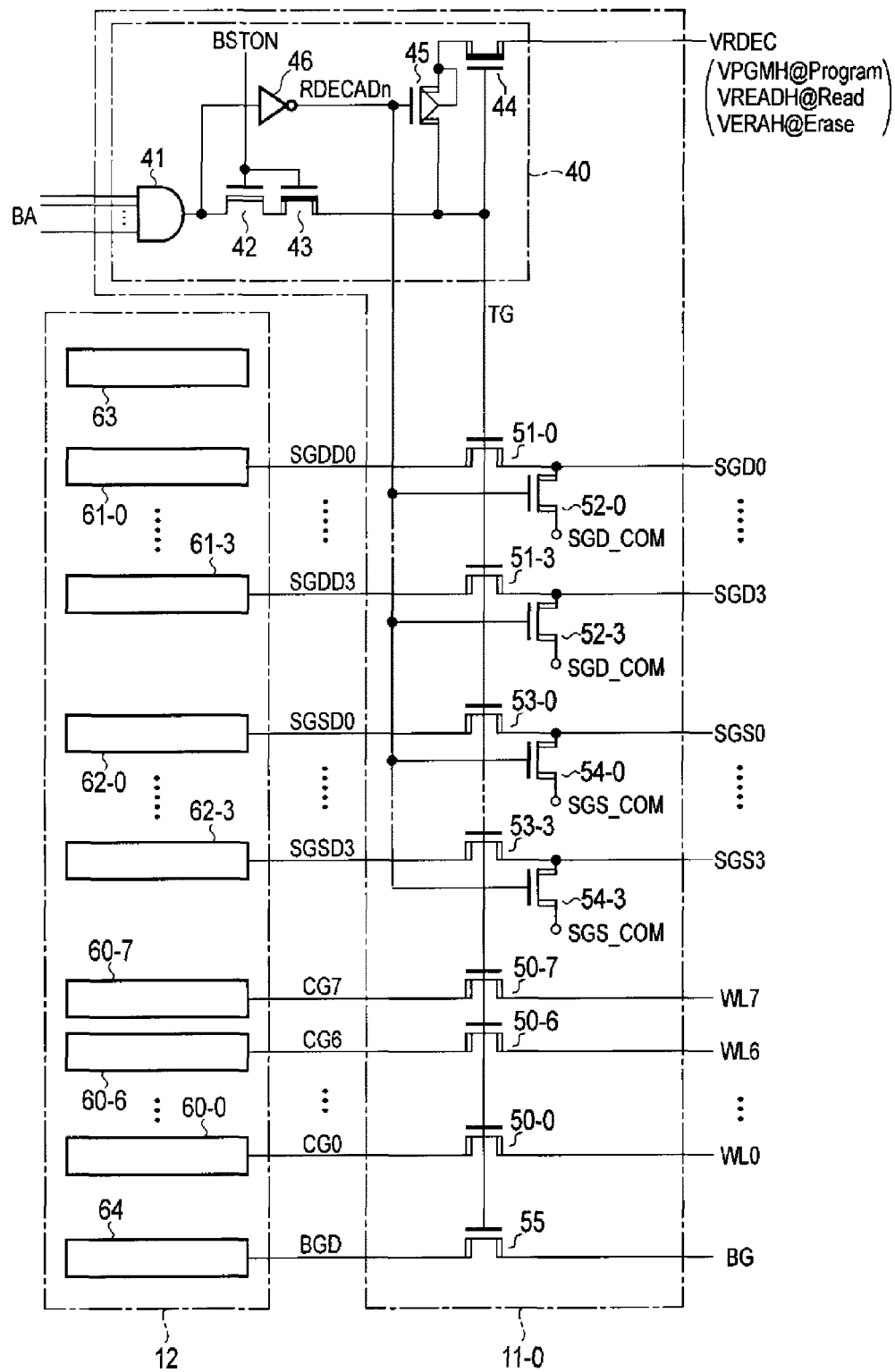
FIG. 3 is a block diagram of a row decoder and a driver circuit according to a first embodiment.

Next, the configuration of the row decoders 11 will be described. The row decoders 11-0 to 11-3 are provided for the blocks BLK0 to BLK3, respectively, and are provided for selecting and not selecting the blocks BLK0 to BLK3. FIG. 3 shows the configurations of the row decoder 11-0 and the driver circuit 12. In addition, the configurations of the row decoders 11-1 to 11-3 are the same as the row decoder 11-0.

As shown in the drawing, the row decoder 11 includes a block decoder 40 and high-voltage n-channel enhancement-type (E-type: threshold value is positive) MOS transistors 50 to 54 (50-0 to 50-7, 51-0 to 51-3, 52-0 to 52-3, 53-0 to 53-3, and 54-0 to 54-3), and 55. All of the transistors 50 to 54 are high-voltage type, and for example, impurity concentration in the channel regions are equivalent and the threshold voltage thereof are equivalent.

1.1.3.1 Block Decoder 40

As shown in the drawing, the block decoder 40 includes an AND gate 41, a low-voltage n-channel depression-type MOS transistor 42, high-voltage n-channel depression-type (D-type: threshold value is negative) MOS transistors 43 and 44, a high-voltage p-channel E-type MOS transistor 45, and an inverter 46.

The AND gate 41 performs AND operation of each bit of a block address BA supplied by the external portion (controller or host device). When the block address BA shows the block BLK0 corresponding to the row decoder 11-0, the AND gate 41 outputs the "H" level.

The inverter 46 inverts the output of the AND gate 41 and outputs as a signal RDECADn.

One end of the current path of the transistor 42 is connected to an output node of the AND gate 41, and a signal BSTON is applied to the gate. In addition, one end of the current path of the transistor 43 is connected to the other end of the current path of the transistor 42, the other end of the current path is connected to a signal line TG, and the signal BSTON is applied to the gate. The signal BSTON is a signal asserted ("H" level) when inputting of the address information of the block decoder 40, and is supplied by the control circuit 16, for example.

One end of the current path of the transistor 45 is connected to the signal line TG, the other end of the current path is connected to the back gate, and the signal RDECADn is input to the gate. Voltage VRDEC is applied to one end of the current path of the transistor 44, the other end thereof is connected to the other end of the current path of the transistor 45, and the gate is connected to the signal line TG.

When writing, reading out, and erasing the data, in a case where the block address BA corresponds to the block BLK0, the transistors 44 and 45 are turned on, and accordingly, the signal line TG is turned to the "H" level (voltage VRDEC). On the other hand, if the block address BA does not correspond to the block BLK0, the MOS transistors 44 and 45 are turned off, and the signal line TG is turned to the "L" level (for example, 0 V or negative voltage VBB).

1.1.3.2 Transistors 50

Next, the transistors 50 will be described. The transistors 50 are for transmitting the voltage to the word lines WL of the selected block BLK. One ends of the current paths of the respective transistors 50-0 to 50-7 are connected to the word lines WL0 to WL7 of the corresponding block BLK0, respectively, the other ends thereof are connected to signal lines CG0 to CG7, respectively, and the gates thereof are commonly connected to the signal line TG.

Accordingly, in the row decoder 11-0 corresponding to the selected block BLK0, for example, the transistors 50-0 to 50-7 are turned on and the word lines WL0 to WL7 are connected to the signal lines CG0 to CG7. On the other hand, in the row decoders 11-1 to 11-3 corresponding to the non-selected blocks BLK1 to BLK3, the transistors 50-0 to 50-7 are turned off and the word lines WL0 to WL7 are disconnected from the signal lines CG0 to CG7.

1.1.3.3 Transistors 51 and 52

Next, transistors 51 and 52 will be described. The transistors 51 and 52 are for transmitting the voltage to the selection gate lines SGD. One ends of the current paths of the respective transistors 51-0 to 51-3 are connected to the selection gate lines SGD0 to SGD3 of the corresponding block BLK0, the other ends thereof are connected to signal lines SGDD0 to SGDD3, and the gates thereof are commonly connected to the signal line TG. In addition, one ends of the current paths of the respective transistors 52-0 to 52-3 are connected to the selection gate lines SGD0 to SGD3 of the corresponding block BLK0, the other ends thereof are connected to nodes SGD_COM, and the signal RDECADn is applied to the gate. The voltage such as 0 V or negative voltage VBB for turning off the selection transistor ST1 is applied to the nodes SGD_COM.

Accordingly, in the row decoder 11-0 corresponding to the selected block BLK0, for example, the transistors 51-0 to 51-3 are turned on and the transistors 52-0 to 52-3 are turned off. Thus, the selection gate lines SGD0 to SGD3 of the selected block BLK0 are connected to the signal lines SGDD0 to SGDD3.

On the other hand, in the row decoders 11-1 to 11-3 corresponding to the non-selected blocks BLK1 to BLK3, the transistors 51-0 to 51-3 are turned off and the transistors 52-0 to 52-3 are turned on. Thus, the selection gate lines SGD0 to SGD3 of the non-selected blocks BLK1 to BLK3 are connected to the nodes SGD_COM.

1.1.3.4 Transistors 53 and 54

The transistors 53 and 54 are for transmitting the voltage to the selection gate lines SGS, and the connection and the operation thereof are equivalent with a case where, in the transistors 51 and 52, the selection gate lines SGD are substituted with the selection gate lines SGS, the signal lines SGDD0 to SGDD3 are substituted with signal lines SGSD0 to SGSD3, and the nodes SGD_COM are substituted with nodes SGS_COM. The voltage for turning off the selection transistor ST2 is applied to the nodes SGS_COM.

That is, in the row decoder 11-0 corresponding to the selected block BLK0, the transistors 53-0 to 53-3 are turned on and the transistors 54-0 to 54-3 are turned off. On the other hand, in the row decoders 11-1 to 11-3 corresponding to the non-selected blocks BLK1 to BLK3, the transistors 53-0 to 53-3 are turned off and the transistors 54-0 to 54-3 are turned on.

1.1.3.5 Transistor 55

Next, the transistor 55 will be described. The transistor 55 is for transmitting the voltage to the back gate line BG. One end of the current path of the transistor 55 is connected to the back gate line BG0 of the corresponding block BLK0, the other end thereof is connected to a signal line BGD, and the gate thereof is commonly connected to the signal line TG.

Accordingly, in the row decoder 11-0 corresponding to the selected block BLK0, the transistor 55 is turned on, and in the row decoders 11-1 to 11-3 corresponding to the non-selected blocks BLK1 to BLK3, the transistor 55 is turned off.

1.1.4 Driver Circuit 12

Next, the configuration of the driver circuit 12 will be described. The driver circuit 12 transmits the voltage necessary for writing, reading out, and erasing the data, to each of the signal lines CG0 to CG7, SGDD0 TO SGDD3, SGSD0 TO SGSD3, and BGD.

As shown in FIG. 3, the driver circuit 12 includes CG drivers 60 (60-0 to 60-7), SGD drivers 61 (61-0 to 61-3), SGS drivers 62 (62-0 to 62-3), a BG driver 64, and a voltage driver 63.

1.1.4.1 Voltage Driver 63

First, the voltage driver 63 will be described. The voltage driver 63 generates voltage to be used in the block decoder 40 and the CG drivers 60.

Figure 4:
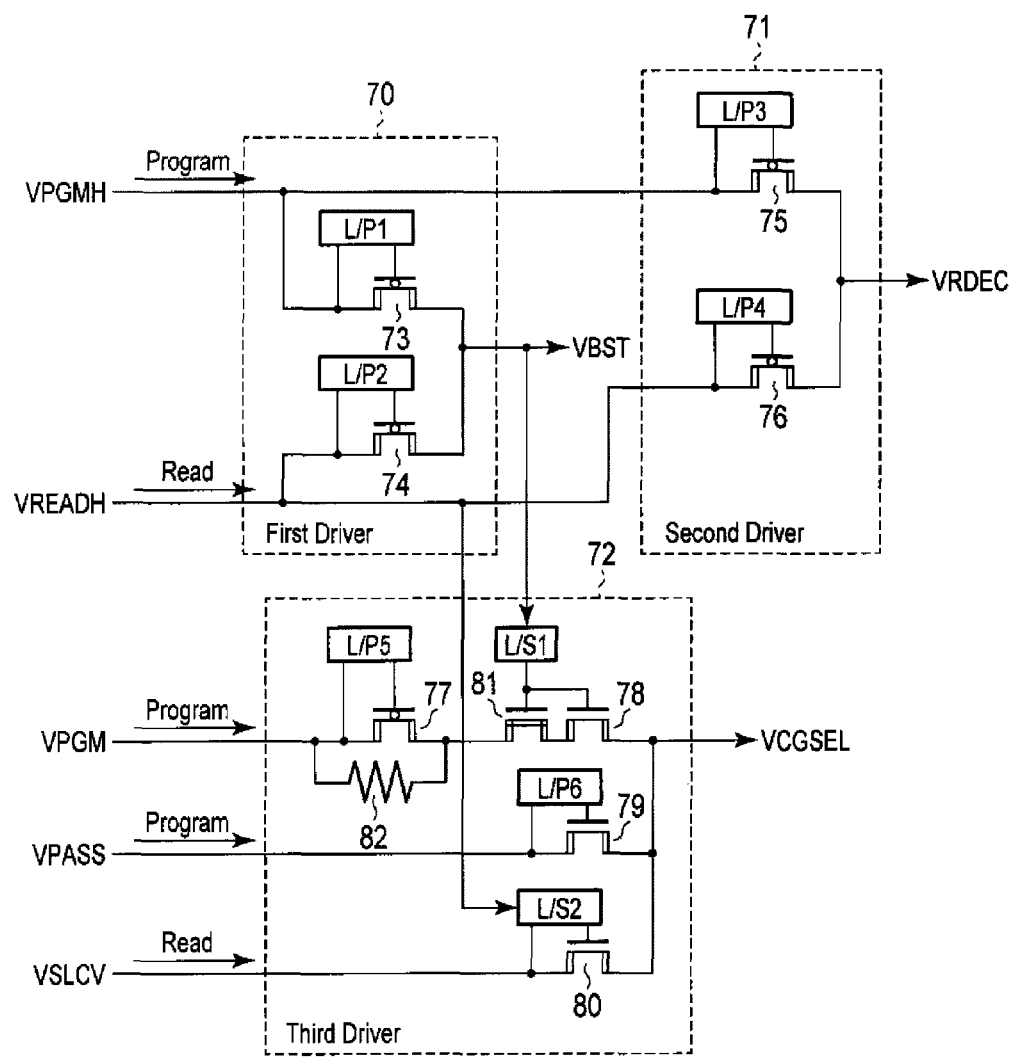
FIG. 4 is a circuit diagram of a voltage driver according to a first embodiment.

FIG. 4 is a circuit diagram of the voltage driver 63. As shown in the drawing, the voltage driver 63 includes first to third drivers 70 to 72 which generate voltage VBST, VRDEC, and VCGSEL, respectively.

The first driver 70 includes high-voltage n-channel MOS transistors 73 and 74 and local pump circuits L/P1 and L/P2.

The voltage VPGMH is applied to one end of the current path of the transistor 73 when performing the programming, and the one end of the current path of the transistor 73 is connected to the local pump circuit L/P1. The voltage VPGMH is supplied by the voltage generation circuit 15 and is voltage greater than the voltage VPGM. VPGM is a high voltage applied to the selected word lines when performing the programming. In addition, a voltage is applied to the gate of the transistor 73 from the local pump circuit L/P1, when performing the programming.

The voltage VREADH is applied to one end of the current path of the transistor 74 when performing the reading-out, and the one end of the current path of the transistor 74 is connected to the local pump circuit L/P2. The voltage VREADH is supplied by the voltage generation circuit 15 and is voltage greater than the voltage VREAD. VREAD is voltage applied to the non-selected word lines when performing the reading-out, and is a voltage for turning on the memory cell transistors MT. In addition, a voltage is applied to the transistor 74 from the local pump circuit L/P2 when performing the reading-out. The other ends of the current paths of the transistors 73 and 74 are commonly connected, and the voltage of the commonly connected node is output as the voltage VBST. In addition, the operation "when performing the reading-out" in the following description is the same as a verification operation when performing the data writing.

In the configuration, the transistor 73 is turned on when performing the programming and the first driver 70 outputs the voltage VBST=VPGMH. In addition, when performing the reading-out, the transistor 74 is turned on, and the voltage VBST=VREADH is output.

Next, the second driver 71 will be described. The second driver 71 includes high-voltage n-channel MOS transistors 75 and 76, and local pump circuits L/P3 and L/P4.

The voltage VPGMH is applied to one end of the current path of the transistor 75 when performing the programming, and the one end of the current path of the transistor 75 is connected to the local pump circuit L/P3. In addition, a voltage is applied to the gate of the transistor 75 from the local pump circuit L/P3 when performing the programming.

The voltage VREADH is applied to one end of the current path of the transistor 76 when performing the reading-out, and the one end of the current path of the transistor 76 is connected to the local pump circuit L/P4. In addition, a voltage is applied to the gate of the transistor 76 from the local pump circuit L/P4 when performing the reading-out. The other ends of the current paths of the transistors 75 and 76 are commonly connected, and the voltage of the commonly connected node is output as the voltage VRDEC.

In the configuration, the transistor 75 is turned on when performing the programming, and the second driver 71 outputs the voltage VRDEC=VPGMH. In addition, the transistor 76 is turned on when performing the reading-out, and the voltage VRDEC=VREADH is output.

Next, the third driver 72 will be described. The third driver 72 includes high-voltage n-channel MOS transistors 77 to 80, a high-voltage n-channel depression-type MOS transistor 81, a resistance element 82, local pump circuits L/P5 and L/P6, and level shifters L/S1 and L/S2.

The voltage VPGM is applied to one end of the transistor 77 and the one end of the transistor 77 is connected to the local pump circuit L/P5. Further, a voltage is applied to the gate of the transistor 77 by the local pump circuit L/P5.

One end of the current path of the transistor 81 is connected to the other end of the current path of the transistor 77, and the other end thereof is connected to one end of the current path of the transistor 78. The output of the level shifter L/S1 is applied to the gate of the transistors 81 and 78. The level shifter L/S1 receives the voltage VBST from the first driver 70 when performing the programming and shifts the level and outputs the shifted voltage.

The voltage VPASS is applied to one end of the current path of the transistor 79, the one end of the current path of the transistor 79 is connected to the local pump circuit L/P6, and the output of the local pump circuit L/P6 is applied to the gate. The voltage VPASS is voltage applied to the non-selected word lines of the non-selected blocks when performing the programming, and is a voltage for turning on the memory cell transistors MT.

The voltage VSLCV is applied to one end of the current path of the transistor 80, and the output of the level shifter L/S2 is applied to the gate thereof. The level shifter L/S2 receives the voltage VREADH from the voltage generation circuit 15 when performing the reading-out, and shifts the level and outputs the shifted voltage.

One end of the resistance element 82 is connected to one end of the current path of the transistor 77 and the other end thereof is connected to the other end of the current path of the transistor.

The other ends of the current paths of the transistors 78 to 80 are commonly connected, this commonly connected node becomes the output node of the third driver 72, and the voltage VCGSEL is output.

Figure 5:
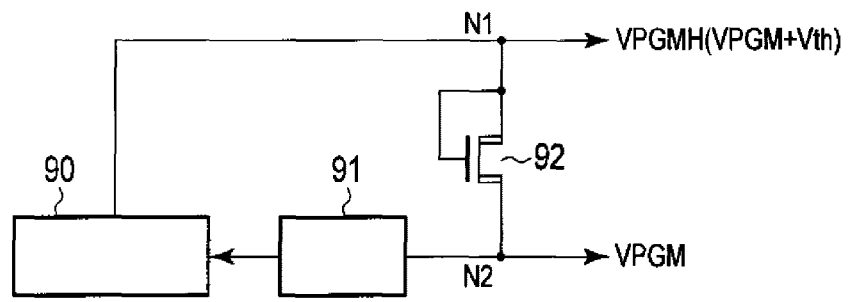
FIG. 5 is a circuit diagram of a voltage generation circuit according to a first embodiment.

In addition, the voltage items VPGMH, VREADH, VPASS, and VSLCV are generated by a charge pump circuit in the voltage generation circuit 15. In addition, the voltage VPGM and VREAD are generated by reducing the voltage of the voltage VPGMH and VREADH. FIG. 5 shows a configuration for generating the voltage VPGMH and VPGM as an example in the voltage generation circuit 15.

As shown in the drawing, the voltage generation circuit 15 includes a charge pump circuit 90, a limiter circuit 91, and a high-voltage n-channel MOS transistor 92. The charge pump circuit 90 generates the voltage VPGMH and outputs this to a node N1. The transistor 92 is diode-connected between the node N1 and a node N2. The transistor 92 has the same size and the same threshold voltage as the transistor 50.

The potential of the node N2 is output as VPGM. Accordingly, VPGMH=VPGM+Vth. Herein, Vth is the threshold voltage of the transistor 92. In addition, the limiter circuit 91 monitors the voltage VPGM and controls the charge pump circuit 90 so that the VPGM becomes a desirable value. The same operation is performed for VREADH and VREAD.

1.1.4.2 CG Drivers 60

Figure 6:
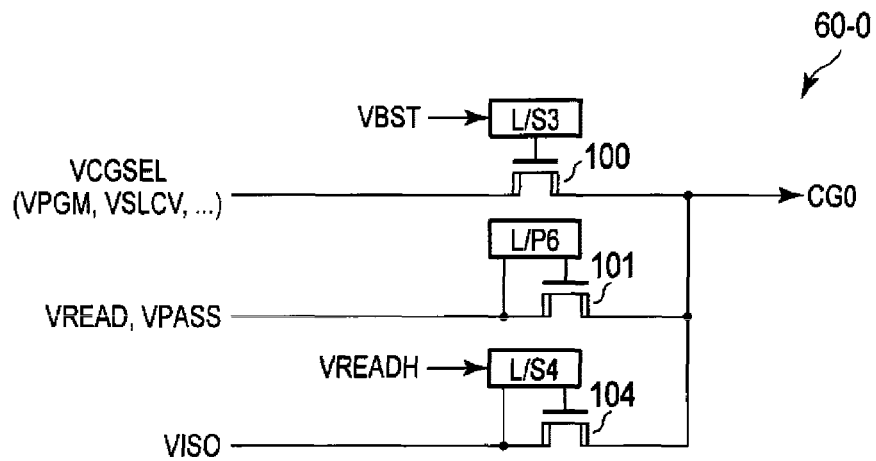
FIG. 6 is a circuit diagram of a CG driver according to a first embodiment.

Next, the CG drivers 60 will be described. The CG drivers 60-0 to 60-7 transmit necessary voltages to the signal lines CG0 to CG7 (word lines WL0 to WL7), respectively. FIG. 6 is a circuit diagram of the CG driver 60-0. The other CG drivers 60-1 to 60-7 have the same configuration.

As shown in the drawing, the CG driver 60 includes high-voltage n-channel E-type MOS transistors 100, 101, and 104, a local pump circuit L/P6, and level shifters L/S3 and L/S4.

The voltage VCGSEL is applied to one end of the current path of the transistor 100, the other end of the current path thereof is connected to the corresponding signal line CG (e.g., CGi in CG driver 60-*i*, where i is any one of 0 to 7), and the output of the level shifter L/S3 is applied to the gate thereof. The level shifter L/S3 receives the voltage VBST from the voltage driver 63 when performing the programming or the reading-out, and shifts the level and outputs the shifted voltage. The voltage VPASS is applied to one end of the current path of the transistor 101 when performing the programming, the voltage VREAD is applied thereto when performing the reading-out, the one end of the current path of the transistor 101 is connected to the local pump circuit L/P6, the other end of the current path thereof is connected to the corresponding signal line CG, and the output of the local pump circuit L/P6 is applied to the gate thereof. The voltage VISO is applied to one end of the current path of the transistor 104, the other end of the current path thereof is connected to the corresponding signal line CG, and the output of the level shifter L/S4 is applied to the gate thereof. The level shifter L/S4 receives the voltage VREADH when performing the programming, and shifts the level and outputs the shifted voltage. In addition, the voltage VISO is a voltage for turning off the memory cell transistors MT.

In the configuration, in the CG drivers 60 corresponding to selected word lines WL, by turning on the transistor 100 when performing the programming by the control circuit 16, for example, the voltage VPGM (VCGSEL=VPGM) is transmitted to the corresponding signal line CG. In addition, when performing the reading-out, by turning on the transistor 100, the voltage VSLCV (VCGSEL=VSLCV) is transmitted to the corresponding signal line CG. Further, these voltage items are transmitted to the selected word lines WL through the current paths of the transistors 50 in the row decoders 11.

In addition, in the CG driver 60 corresponding to the non-selected word line, the transistor 101 or the transistor 104 is turned on when performing the programming, by the control circuit 16, for example. The CG driver 60 in which the transistor 101 is turned on, transmits the voltage VPASS to the corresponding signal line CG. The CG driver 60 in which the transistor 104 is turned on, transmits the voltage VISO to the corresponding signal line CG. When performing the reading-out, by turning on the transistor 101, the voltage VREAD is transmitted to the corresponding signal line CG. These voltage items are transmitted to the non-selected word lines WL through the current paths of the transistors 50 in the row decoders 11.

In addition, CG0 to CG7 may be commonly used between each block BLK. That is, four word lines WL0 each belonging to four blocks BLK0 to BLK3 may be driven in the same CG driver 60-0 through the transistor 50-0 of the corresponding row decoders 11-0 to 11-3. The other signal lines CG1 to CG7 also have the same configuration.

1.1.4.3 SGD Drivers 61

Figure 7:
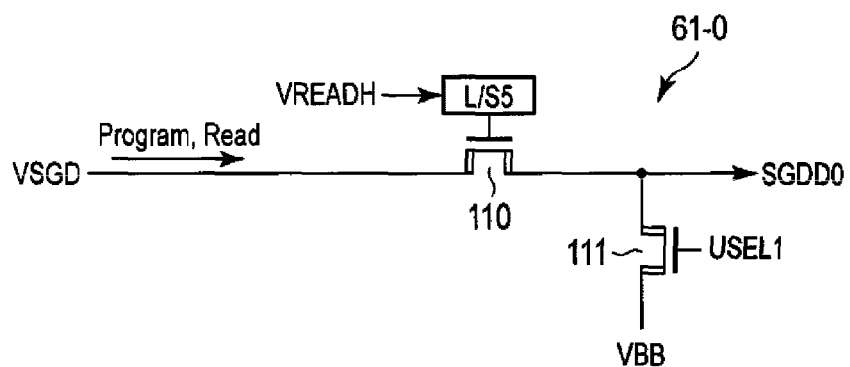
FIG. 7 is a circuit diagram of a SGD driver according to a first embodiment.

SGD drivers 61 will be described. The SGD drivers 61-0 to 61-3 transmit the necessary voltage to the signal lines SGDD0 to SGDD3 (selection gate lines SGD0 to SGD3), respectively. FIG. 7 is a circuit diagram of the SGD driver 61-0. The other SGD drivers 61-1 to 61-3 also have the same configuration.

As shown in the drawing, the SGD driver 61 includes high-voltage n-channel E-type MOS transistors 110 and 111, and a level shifter L/S5. The voltage VSGD is applied to one end of current path of the transistor 110, the other end of the current path thereof is connected to the corresponding signal line SGDD (SGDDj in SGD driver 61-j, j is any one of 0 to 3), and the output of the level shifter L/S5 is applied to the gate thereof. The level shifter L/S5 receives the voltage VREADH when performing the programming or the reading-out, and shifts the level and outputs the shifted voltage. In the transistor 111, the negative voltage VBB is applied to the source, for example, the drain is connected to the corresponding signal line SGDD, and a signal USEL1 is applied to the gate. When the SGD driver 61 corresponds to the NAND string including the selection cells when performing the writing and the reading-out, the signal USEL1 is turned to the "L" level (for example, VBB) by the control circuit 16, and is turned to the "H" level in the other SGD drivers 61.

In the configuration described above, when performing the reading-out and writing of the data, in the SGD driver 61 corresponding to the selection gate line SGD connected to the NAND string 17 including the selected word line, the transistor 110 is turned on and the transistor 111 is turned off. Accordingly, the voltage VSGD is transmitted to the corresponding signal line SGDD. The voltage VSGD is a voltage for turning on the selection transistor ST1 when performing the reading-out (and for turning on the transistor according to the data to be written, when performing the writing). On the other hand, in the other SGD driver 61, the transistor 111 is turned on and the transistor 110 is turned off, and accordingly, the negative voltage VBB is transmitted to the signal line SGDD.

1.1.4.4 SGS Drivers 62

Figure 8:
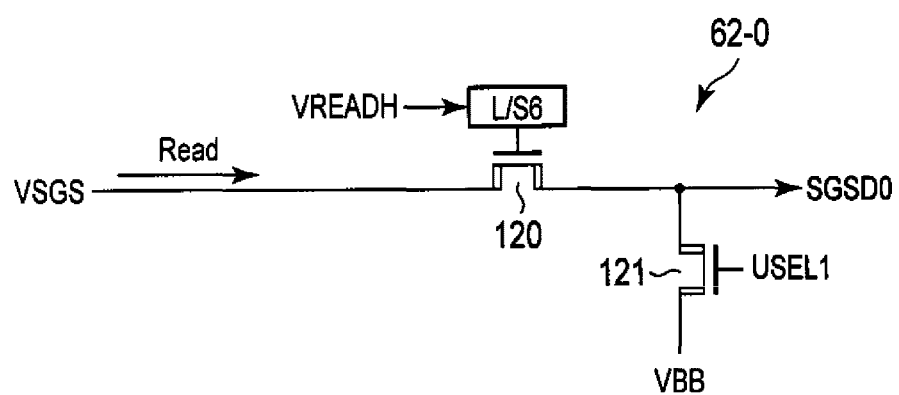
FIG. 8 is a circuit diagram of a SGS driver according to a first embodiment.

Next, SGS drivers 62 will be described. The SGS drivers 62-0 to 62-3 transmit necessary voltage to the signal lines SGSD0 to SGSD3 (selection gate lines SGS0 to SGS3), respectively. FIG. 8 is a circuit diagram of the SGS driver 62-0. The other SGS drivers 62-1 to 62-3 have the same configuration.

As shown in the drawing, the SGS driver 62 includes high-voltage n-channel MOS transistors 120 and 121, and a level shifter L/S6. The voltage VSGS is applied to one end of the current path of the transistor 120, the other end of the current path thereof is connected to the corresponding signal line SGSD (SGSDk in SGS driver 62-k, k is any one of 0 to 3), and the output of the level shifter L/S6 is applied to the gate thereof. The level shifter L/S6 receives the voltage VREADH when performing the reading-out, and shifts the level and outputs the shifted voltage. In the transistor 121, the negative voltage VBB is applied to the source, the drain is connected to the corresponding signal line SGSD, and a signal USEL2 is applied to the gate. When performing the writing, in all SGS drivers 62, the signal USEL2 is turned to the "H" level by the control circuit 16, for example. On the other hand, when performing the reading-out, the signal is turned to the "L" level (for example, VBB) when the SGD driver 61 corresponds to the NAND string including the selection cells, and is turned to the "H" level in the other SGD drivers 61.

In the configuration described above, when performing the reading-out, in the SGS driver 62 corresponding to the selection gate line SGS connected to the NAND string 17 including the selected word line, the transistor 120 is turned on and the transistor 121 is turned off, and accordingly, the voltage VSGS is transmitted to the corresponding signal line SGSD. The voltage VSGS is a voltage for turning on the selection transistor ST2. On the other hand, in the other SGS drivers 62, the transistor 121 is turned on and the transistor 120 is turned off, and accordingly, the negative voltage VBB is transmitted to the signal line SGSD.

When performing the writing, in all SGS drivers 62, the transistor 120 is turned off and the transistor 121 is turned on, and accordingly, the negative voltage VBB is transmitted to the signal line SGSD.

1.1.4.5 BG Driver 64

Next, the BG driver 64 will be described. The BG driver 64 corresponds to a driver obtained by closing the path to which VCGSEL is transmitted, in the CG driver 60 described in FIG. 6, for example. That is, when performing the writing, VPASS or VISO is transmitted to the back gate line BG by the transistor 101 or 104, and when performing the reading-out, VREAD is transmitted to the back gate line BG by the transistor 101.

1.1.5 Sense Amplifier 13 and Data Latch 14

Figure 9:
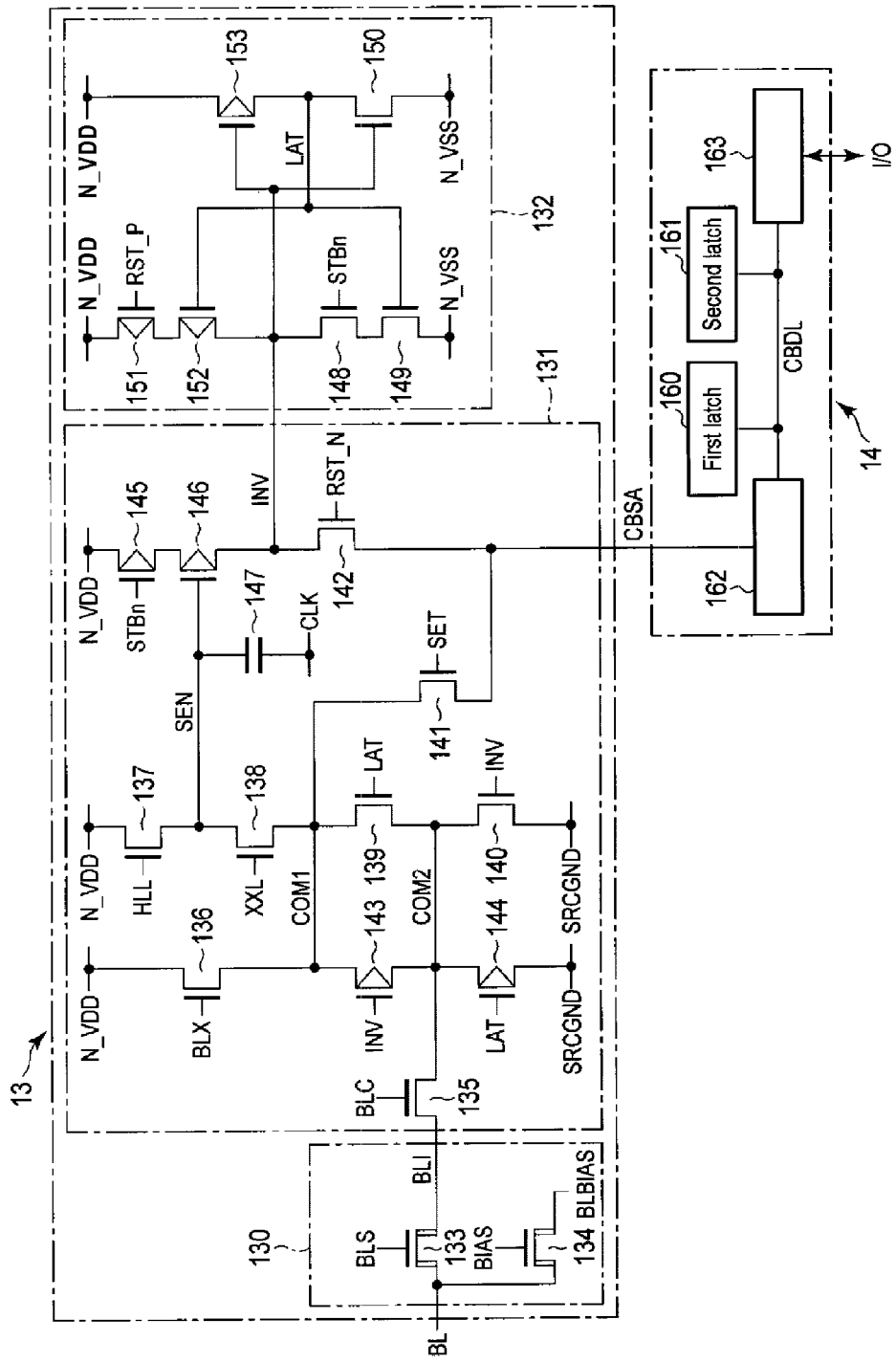
FIG. 9 is a circuit diagram of a sense amplifier and a data latch according to a first embodiment.

The configurations of the sense amplifier 13 and the data latch 14 will be described referring to FIG. 9. FIG. 9 is a circuit diagram of the sense amplifier 13 and the data latch 14, and the configuration shown in FIG. 9 is provided for each bit line BL.

1.1.5.1 Sense Amplifier 13

First, the sense amplifier 13 will be described. As shown in the drawing, the sense amplifier 13 broadly includes a bit line hook-up unit 130, a sense amplifier unit 131, and a data holding unit 132.

The bit line hook-up unit 130 includes high-voltage n-channel MOS transistors 133 and 134. A signal BLS is applied to the gate of the transistor 133, one end of the current path thereof is connected to the corresponding bit line BL, and the other end thereof is connected to a node BLI. A signal BIAS is input to the gate of the transistor 134, one end of the current path thereof is connected to the corresponding bit line BL, and a signal BLBIAS having a fixed potential is applied to the other end thereof.

The sense amplifier unit 131 includes low-voltage n-channel MOS transistors 135 to 142, low-voltage p-channel MOS transistors 143 to 146, and a capacitor element 147.

One end of the current path of the MOS transistor 135 is connected to the corresponding node BLI, the other end thereof is connected to a node COM2, and a signal BLC is applied to the gate thereof.

One end of the current path of the MOS transistor 144 is connected to the node COM2, the other end thereof is connected to a node SRCGND (for example, 0 V), and the gate thereof is connected to a node LAT. One end of the current path of the MOS transistor 140 is connected to the node COM2, the other end thereof is connected to a node SRCGND, and the gate thereof is connected to a node INV. One end of the current path of the MOS transistor 143 is connected to the node COM2, the other end thereof is connected to the node COM1, and the gate thereof is connected to the node INV. One end of the current path of the MOS transistor 139 is connected to the node COM2, the other end thereof is connected to the node COM1, and the gate thereof is connected to the node LAT. One end of the current path of the MOS transistor 141 is connected to the node COM1, the other end thereof is connected to a common bus CBSA, and a signal SET is applied to the gate thereof. The common bus CBSA is a bus for connecting the sense amplifier unit 131 and the data latch 14. One end of the current path of the MOS transistor 136 is connected to a node N_VDD to which power-supply voltage VDD is applied, the other end thereof is connected to the node COM1, and a signal BLX is input to the gate thereof. One end of the current path of MOS transistor 138 is connected to a node SEN, the other end thereof is connected to the node COM1, and a signal XXL is input to the gate thereof. One end of the current path of MOS transistor 137 is connected to the node N_VDD, the other end thereof is connected to the node SEN, and a signal HLL is input to the gate thereof.

One electrode of the capacitor element 147 is connected to the node SEN and a clock CLK is input to the other electrode thereof.

One end of the current path of the MOS transistor 142 is connected to the node INV, the other end thereof is connected to the common bus CBSA, and a signal RST_N is input to the gate thereof. One end of the current path of the MOS transistor 146 is connected to the node INV and the gate thereof is connected to the node SEN. One end of the current path of the MOS transistor 145 is connected to the node N_VDD, the other end thereof is connected to the other end of the current path of the MOS transistor 146, and a signal STBn is input to the gate thereof.

The data holding unit 132 latches data in the node INV which is the connection node of the MOS transistors 142 and 146. The data holding unit 132 includes n-channel MOS transistors 148 to 150 and p-channel MOS transistors 151 to 153.

One end of the current path of the MOS transistor 148 is connected to the node INV, and the signal STBn is input to the gate thereof. One end of the current path of the MOS transistor 149 is connected to a node N_VSS, the other end thereof is connected to the other end of the current path of the MOS transistor 148, and the gate thereof is connected to the node LAT. The voltage VSS (for example, 0 V) is applied to the node N_VSS. One end of the current path of the MOS transistor 152 is connected to the node INV, and the gate thereof is connected to the node LAT. One end of the current path of the MOS transistor 151 is connected to the node N_VDD, the other end thereof is connected to the other end of the current path of the transistor 152, and a signal RST_P is input to the gate thereof. One end of the current path of the MOS transistor 150 is connected to the node N_VSS, the other end thereof is connected to the node LAT, and the gate thereof is connected to the node INV. One end of the current path of the MOS transistor 153 is connected to the node N_VDD, the other end thereof is connected to the node LAT, and the gate thereof is connected to the node INV.

When performing a reset operation, the signals SET and RST_N are turned to the "H" level, and accordingly, the nodes COM1 and INV are turned to the "L" level (0 V) and the node LAT is turned to the "H" level (VDD). On the other hand, when performing the normal operation, the signals are turned to the "L" level, and the transistors 141 and 142 are turned off. Further, when transmitting the data of the sense amplifier 13 to the data latch 14, the signal RST_N is turned to the "H" level. In addition, when performing reset operation, the signal RST_P can be turned to the "H" level, and when performing the normal operation, the signal is turned to the "L" level.

In the configuration described above, when performing the writing of the data, the signal BLS is turned to the "H" level and the bit line BL is connected to the corresponding sense amplifier unit 131, respectively. In addition, the signal BLC is turned to the "H" level and the transistor 135 is turned on. The signal BIAS is turned to the "L" level and the transistor 134 is turned off. Further, the data to be written is transmitted to the data holding unit 132 from the data latch 14. In the sense amplifier 13 corresponding to the selected bit line (bit line corresponding to the memory cells for increasing a threshold value by injecting the charge), the node INV="H" and the node LAT="L". Accordingly, the transistors 143 and 139 are turned off, the transistors 144 and 140 are turned on, and 0 V is applied to the selected bit line. In the sense amplifier 13 corresponding to the non-selected bit line, the node INV="L" and the node LAT="H". Accordingly, the transistors 144 and 140 are turned off and the transistors 143 and 139 are turned on. As a result, the non-selected bit line is charged to VDD, by the transistor 136.

The reading-out of the data is performed two times, for example. When performing the first reading-out, the signal BLS is turned to the "H" level in all sense amplifier 13, and the bit line BL is connected to the corresponding sense amplifier unit 131. In addition, the signal BLC is turned to the "H" level, and the transistor 135 is turned on. First, the transistor 136 charges the bit line BL through the current paths of the transistors 143 and 139 and the nodes COM1 and COM2. The potential of the bit line BL is set to a potential VBL (for example, 0.5 V) by the transistor 135. In addition, by the transistor 137, the capacitor element 147 is charged, and the potential of the node SEN is increased.

If the corresponding memory cell is turned on, the potential of the node SEN is decreased, and the transistor 146 is turned on. By turning the signal STBn to the "H" level, the node INV is turned to the "H" level and the node LAT is turned to the "L" level. As a result, the transistors 144 and 140 are turned on and the bit line BL is fixed to have 0 V. On the other hand, if the corresponding memory cell is turned off, the potential of the node SEN is not decreased, and the transistor 146 is turned off. Accordingly, the node INV is turned to the "L" level and the node LAT is turned to the "H" level.

The second reading-out is performed only for the bit line for which it is determined that the corresponding memory cell has been turned off during the first reading-out. The operation of the sense amplifier 13 corresponding to this bit line is the same as that of the first reading-out. On the other hand, for the bit line for which it is determined that the corresponding memory cell has been turned on during the first reading-out, the transistor 134 is turned on in the corresponding sense amplifier 13, and the bit line BL is connected to the node BLBIAS and the potential thereof is fixed.

After that, in the sense amplifier 13 selected by the data control circuit 15, the transistor 142 is turned on, and the data in the holding circuit 132 is transmitted to the data latch 14 through the common bus CBSA.

1.1.5.2 Data Latch 14

Next, the data latch 14 will be described referring to FIG. 9. As shown in the drawing, the data latch 14 includes a first latch circuit 160, a second latch circuit 161, an arithmetic unit 162, and a transmission unit 163. These circuits are connected by a common data bus CBDL, and as described above, and the combination of the circuits is provided for each bit line BL, that is, for each sense amplifier unit 131 with the configuration shown in FIG. 9.

The first and second latch circuits 160 and 161 can each hold 1-bit of data to be written and 1-bit of data to be read out, respectively. The arithmetic unit 162 performs an arithmetic operation necessary for writing and reading out the data, and transmits the data between the sense amplifier unit 131 and the first and second latch circuits 160 and 161. The transmission unit 163 transmits the data between the input and output circuit (not shown) and the first and second latch circuits 160 and 161.

When performing the reading-out of the data, the data of the data holding unit 132 of the sense amplifier 13 is transmitted to the arithmetic unit 162 through the transistor 142, and further transmits the data to the first latch circuit 160 or the second latch circuit 161. After that, the data to be read out is transmitted to the host device (not shown) by the transmission unit 163.

When performing the writing of the data, the data to be written from the host device is transmitted to the first latch circuit 160 or the second latch circuit 161 by the transmission unit 163. After that, the data to be written is transmitted to the data holding unit 132 through the transistor 142 by the arithmetic unit 162. By doing so, the nodes INV and LAT of the data holding unit 132 have the potential according to the writing data, and as a result, the bit line BL has the potential according to the data to be written.

1.2 Operation of Semiconductor Memory Device 1

Next, the operation of the NAND type flash memory 1 of the configuration described above will be described.

1.2.1 Sequence of Writing

First, the writing operation will be described. In general, the writing operation is a repeating operation of a programming operation and a verification operation. The programming operation is an operation for increasing a threshold value of the memory cell transistors MT by injecting charge to the charge storage layer. The verification operation is an operation for reading-out data immediately after the programming operation and determining whether or not the threshold value approaches a predetermined value. If the data passes the verification operation, the writing of the memory cell transistors MT is completed.

Figure 10:
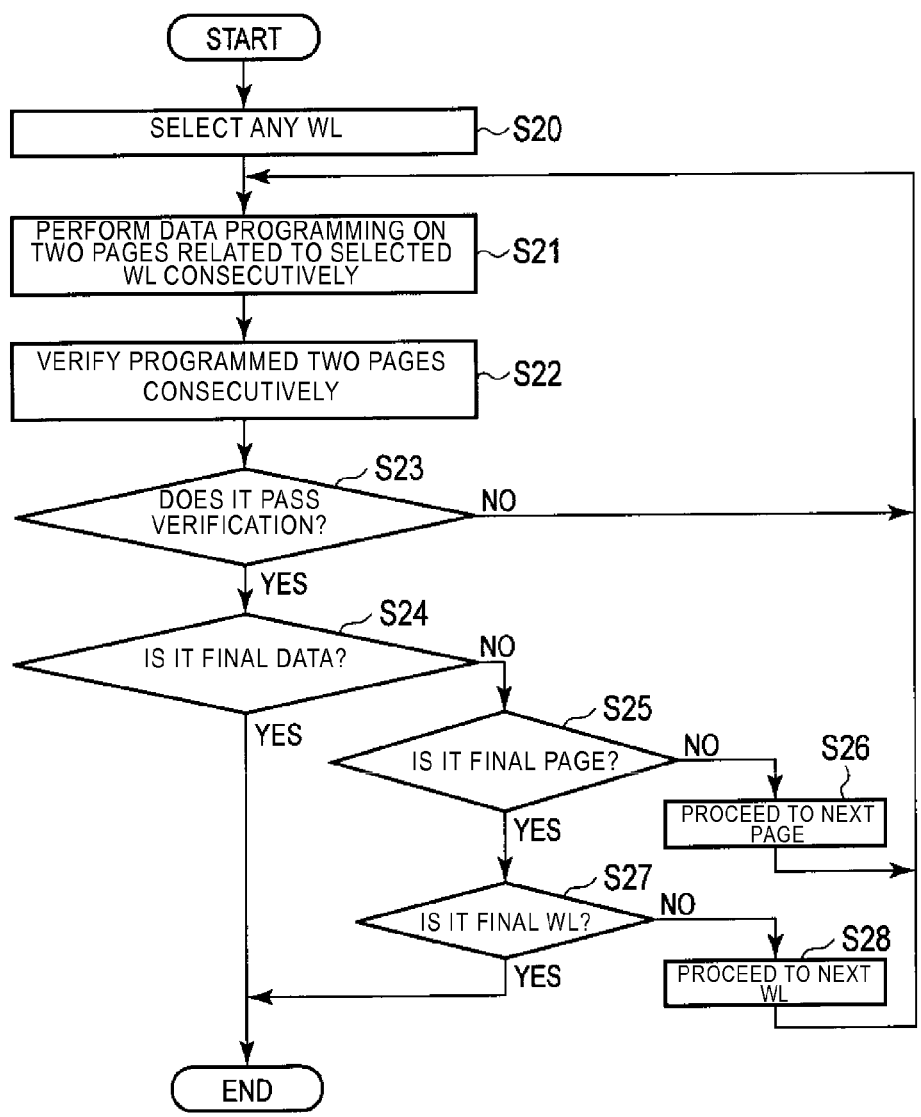
FIG. 10 is a flowchart of a data writing method according to a first embodiment.

FIG. 10 is a flowchart showing details of the writing operation. As shown in the drawing, the row decoder 11 selects any of word lines WL (Step S20). Then, the data is programmed on two pages related to the selected word line WL consecutively (Step S21). In the example of FIG. 2, 1 page is configured by the grouping of the memory cell transistors MT connected to the same word line WL in the same memory group GP. The word line WL is shared for four memory groups GP0 to GP3. That is, for one block BLK, four pages are allocated in one word line WL. If an arbitrary word line WL is selected, among four pages related to this selected word line WL, first, the data is programmed on a page in the memory group GP0, for example, and subsequently the data is programmed on the page in the memory group GP1. The data to be written which is consecutively programmed is held in the first latch circuit 160 and the second latch circuit 161 of the data latch 14.

Next, the data on the two pages which are continuously programmed are consecutively verified (Step S22). If the written data fails the verification (Step S23, NO), that is, if the threshold value of the memory cell transistor MT is not increased to a predetermined value, the process returns to Step S21 and the programming is repeated. If the data passes the verification operation (Step S23, YES), that is, if the threshold value of the memory cell transistor MT is increased to a predetermined value, it is confirmed that the data to be written is remaining or not. If there is no remaining data to be written (Step S24, YES), the process is finished.

When there is remaining data to be written (Step S24, NO) and the pages selected in Steps S21 and S22 are not the last pages among the pages related to the word line WL selected in Step S20 that are to be written (Step S25, NO), the next page is selected (Step S26) and the process returns to Step S21. When the pages thereof are the last pages (Step S25, YES), that is, when the pages are pages allocated in the memory groups GP2 and GP3 in the example of FIG. 2, the next word line WL is selected (Step S28) and the process returns to Step S21. At that time, the data in the latch circuits 160 and 161 of the data latch 14 are updated to the data to be written for the next two pages. The processes described above are repeated until the programming of the entire data is completed (Step S24, YES) or until the programming is performed for the last word line WL of the block BLK (Step S27, YES).

In the embodiment as described above, the programming is consecutively performed with respect to two pages, and subsequently, the verification is consecutively performed with respect to these two pages. The combination thereof is repeated until the data passes the verification operation. Further, if the data passes the verification operation, the same processes are executed with respect to the next two pages.

Figure 11:
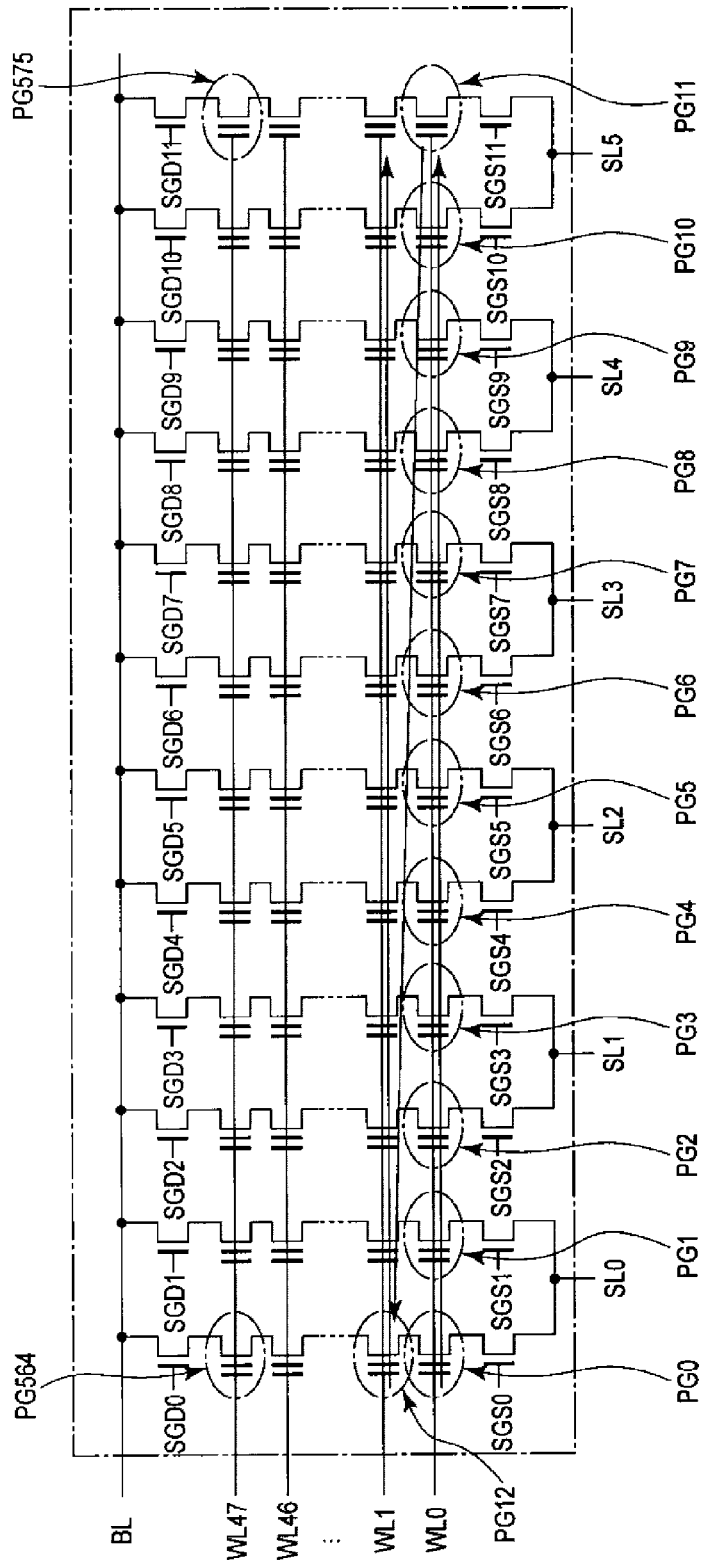
FIG. 11 is a circuit diagram of a memory cell array according to a first embodiment.

The detailed example of the writing operation will be described with a case of the memory cell array 10 shown in FIG. 11 as an example. FIG. 11 shows the NAND string connected to one bit line BL, in an arbitrary block BLK. That is, in the memory cell array 10, the configuration shown in FIG. 11 is provided along a depth direction of plane of the paper disclosed in the drawing, in a multiple manner, the NAND string arranged in the same row in the depth direction shares the selection gate lines SGD and SGS, and configures one memory group GP.

As shown in the drawing, one block BLK includes 12 memory groups GP0 to GP11, the number of the word lines WL are 48, and each memory cell transistor MT holds 1 bit data.

In each NAND string (memory groups GP0 to GP11) connected to the selection gate lines SGD0 to SGD11, the grouping of the memory cells connected to the word line WL0 is called pages PG0 to PG11, respectively. In the same manner, in each NAND string (memory groups GP0 to GP11) connected to the selection gate lines SGD0 to SGD11, the grouping of the memory cells connected to the word line WL1 is called the pages PG12 to PG23, respectively. Accordingly, in each NAND string (memory groups GP0 to GP11) connected to the selection gate lines SGD0 to SGD11, the grouping of the memory cells connected to the last word line WL47 is the pages PG564 to PG575, respectively.

Figure 12:
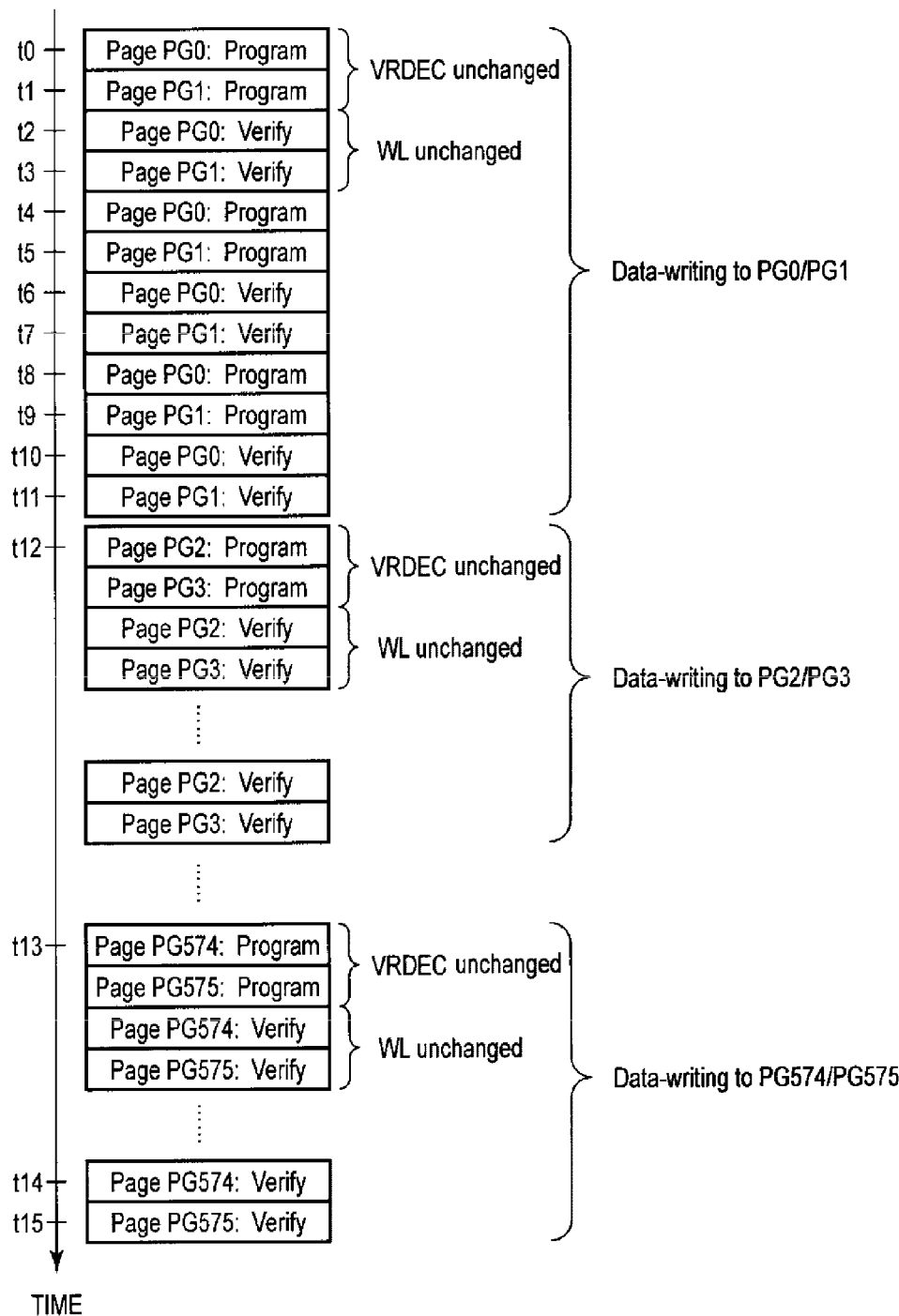
FIG. 12 is a timing chart of a data writing method according to a first embodiment.
Figure 13:
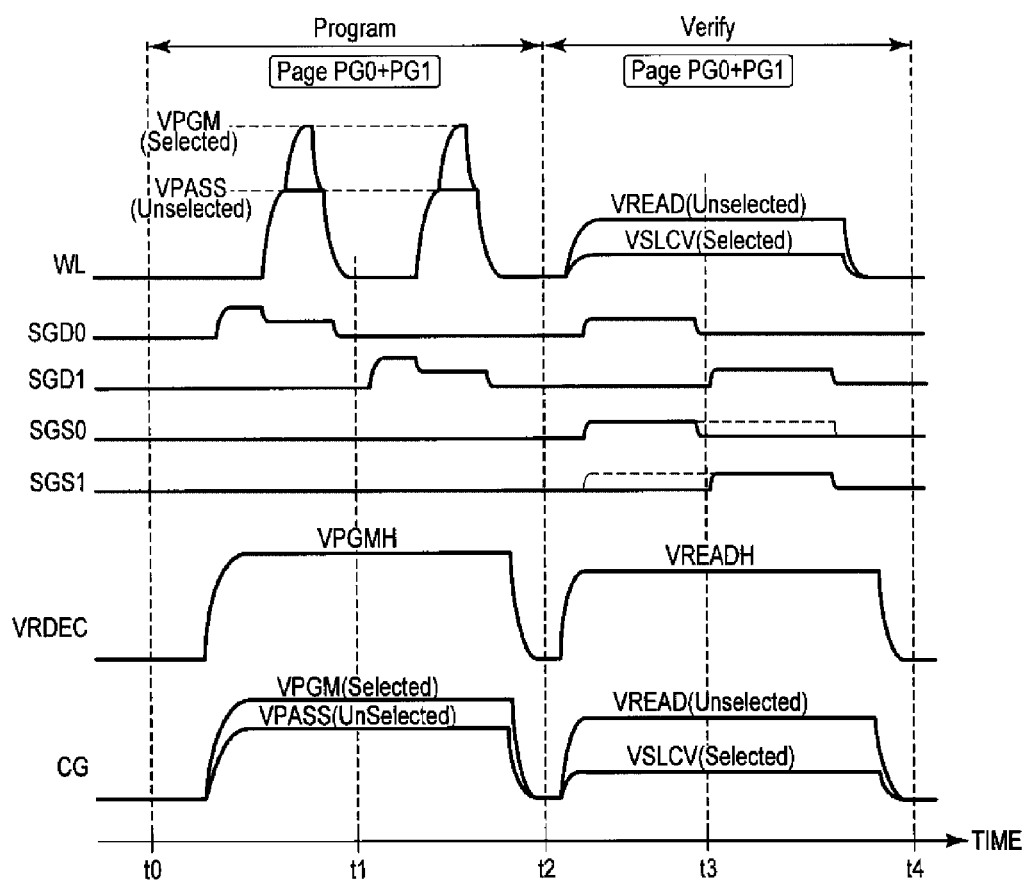
FIG. 13 is a timing chart of various signals at the time of data writing according to a first embodiment.

FIG. 12 is a timing chart showing the sequence of the data writing of the memory cell array 10 shown in FIG. 11. In addition, FIG. 13 is a timing chart showing voltage of each wire of the selected block in the period of time points t0 to t4 of FIG. 12.

As shown in FIG. 12, first, in the time points t0 and t1, the data is consecutively programmed on the pages PG0 and PG1. In more detail, as shown in FIG. 13, in a state where the selection gate line SGD0 is selected, the voltage VPGM is applied to the selected word line WL0, and the voltage VPASS is applied to the non-selected word lines WL1 to WL47. VPGM is a high voltage for injecting the charge to the charge storage layer. In addition, VPASS is a voltage for turning on the memory cell transistor (herein, VPASS<VPGM). As a result, the channel is formed on the NAND string including the selection gate line SGD0 and the selected word line WL0, and the selection transistor ST1 is turned on according to the potential (data to be written) of the bit line. In the NAND string in which the selection transistor ST1 is turned on, for example, 0 V is transmitted to the channel, and accordingly the charge is injected to the charge storage layer of the memory cell transistor MT0. On the other hand, in the NAND string in which the selection transistor ST1 is cut off, the channel is in an electrically floating state, and accordingly, the potential of the channel is increased by the coupling with the word lines WL, and the injection of the charge to the charge storage layer is suppressed.

Subsequently, in a state where the selection gate line SGD1 is selected, the voltage VPGM is applied to the selected word line WL0, and the voltage VPASS is applied to the non-selected word lines WL1 to WL47. Accordingly, the data is programmed in the memory cell transistor MT0 of the NAND string connected to the selection gate line SGD1.

In the process described above, the voltage VRDEC is constant as the voltage VPGMH. In addition, the potential of the signal line CG0 corresponding to the selected word line WL0 is constant as voltage VPGM, and the potential of the signal lines CG1 to CG47 corresponding to the non-selected word lines WL1 to WL47 is constant as the voltage VPASS.

Next, in the time points t2 and t3 of FIG. 12, the data on the pages PG0 and PG1 which is immediately programmed is consecutively verified. In more detail, as shown in FIG. 13, in a state where the selection gate lines SGD0 and SGS0 are selected, the voltage VSLCV is applied to the selected word line WL0, and the voltage VREAD is applied to the non-selected word lines WL1 to WL47. The voltage VSLCV is voltage to be applied to the selected word line, and voltage according to the data which is desired to be read (threshold value level). The voltage VREAD is a voltage for turning on the memory cell transistor (VREAD>VSLCV). As a result, in the NAND string connected to the selection gate lines SGD0 and SGS0, if the memory cell transistor MT0 is turned on, the current flows to the source line SL from the corresponding bit line BL. On the other hand, if the memory cell transistor MT0 is turned off, the current does not flow. By detecting this current by the sense amplifier 13, the data is read out.

Subsequently, in a state where the voltage VSLCV is applied to the selected word line WL0, the selection gate lines SGD1 and SGS1 are selected. Accordingly, the data is read out from the memory cell transistor MT0 of the NAND string connected to the selection gate lines SGD1 and SGS1.

In the process described above, the voltage VRDEC is constant as the voltage VREADH. In addition, the potential of the signal line CG0 corresponding to the selected word line WL0 is constant as voltage VSLCV, and the potential of the signal lines CG1 to CG47 corresponding to the non-selected word lines WL1 to WL47 is constant as the voltage VREAD.

In addition, during the programming and verification operations, the signal TG="L" level in the non-selected block, and the transistors 50, 51, 53, and 55 are turned off. The transistors 52 and 54 are turned on, the selection gate lines SGD and SGS have the negative potential VBB, for example, and the selection transistors ST1 and ST2 are turned off. In addition, the word lines WL0 to WL7 are in an electrically floating state.

Accordingly, the initial programming and verification with respect to the pages PG0 and PG1 are finished. Then, in the time points t4 to t7, the programming and verification with respect to the pages PG0 and PG1 are repeated, and also in the time points t8 to t11, the same operations are repeated.

If the data passes the verification operation in the third programming in the time points t8 to t11, the writing of the data with respect to the next pages PG2 and PG3 is started. That is, from the time point t2, the data is consecutively programmed on the pages PG2 and PG3, and subsequently, the data of the pages PG2 and PG3 is consecutively verified. In FIG. 13, the waveforms of the signal lines at this time are the same as that substituting the SGD0 and SGD1, and SGS0 and SGS1 with SGD2 and SGD3, and SGS2 and SGS3.

Accordingly, hereinafter, from the page PG4 to the last pages PG575, the programming and verification operations are repeated in a unit of two pages. In addition, when performing verification operation, not only the selection gate line SGS of the selected string, but the selection gate line SGS of the non-selected string may also be turned to the "H" level.

1.2.2 Sequence of Reading-Out

Figure 14:
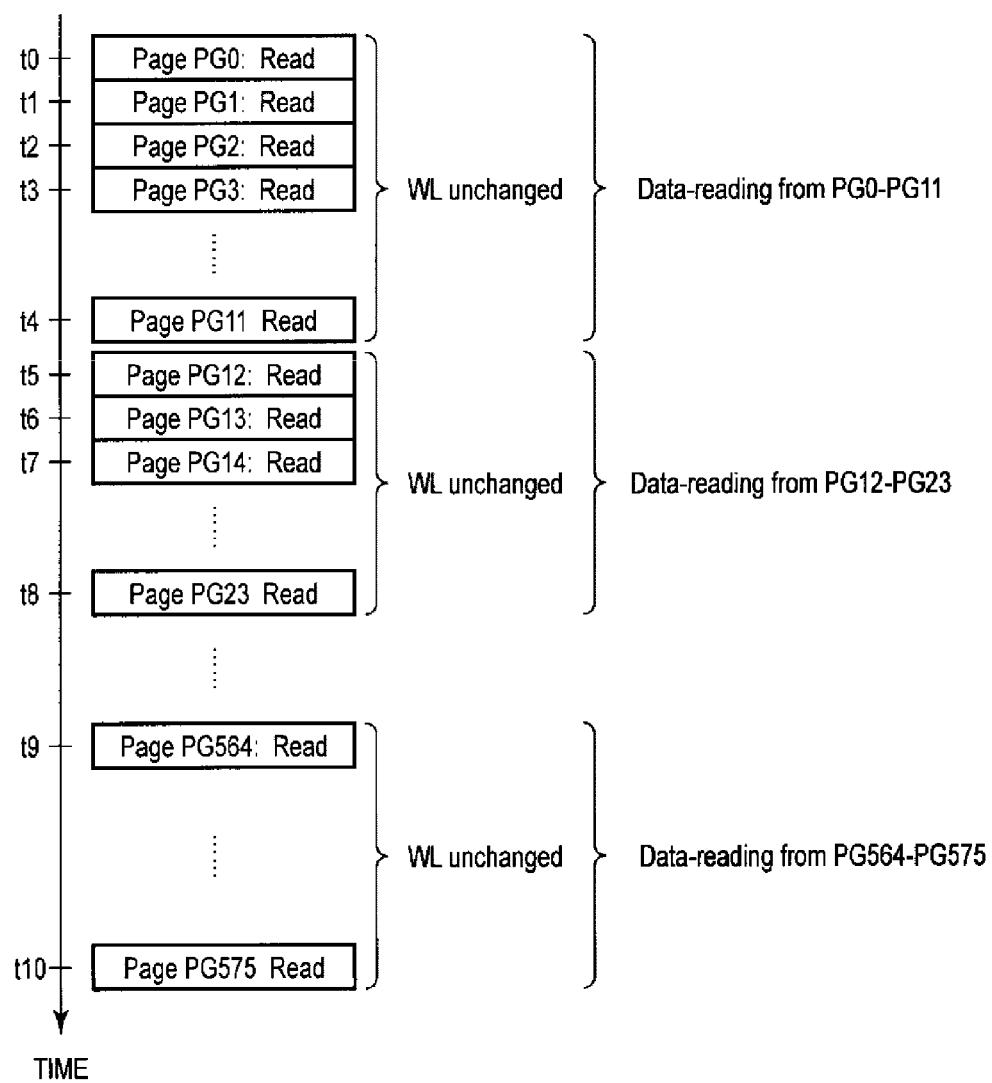
FIG. 14 is a timing chart of a data reading-out method according to a first embodiment.
Figure 15:
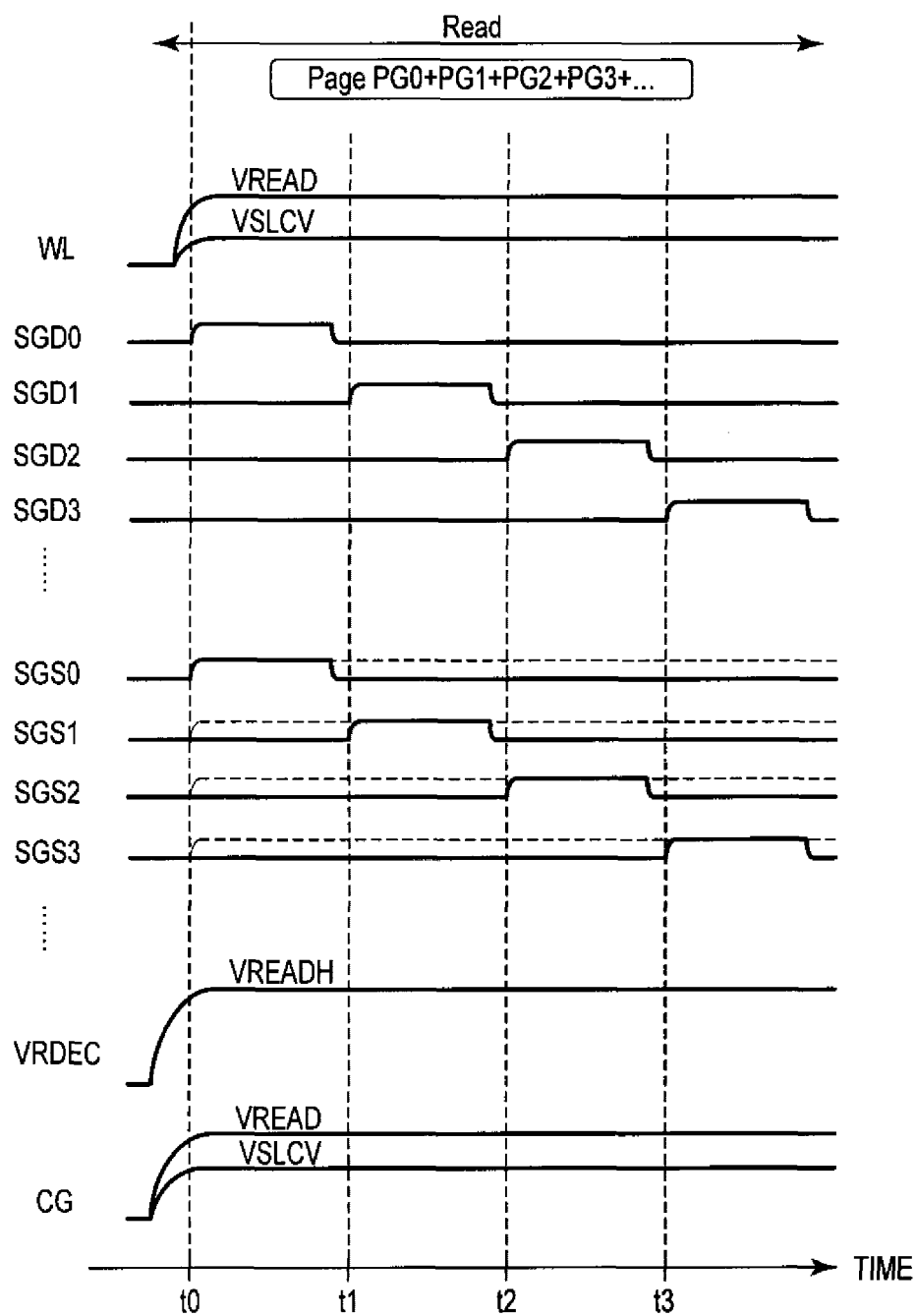
FIG. 15 is a timing chart of various signals at the time of data reading-out according to a first embodiment.

Next, the reading-out operation will be described in detail. The reading-out of the data is orderly performed for each page. FIGS. 14 and 15 show the detailed examples of the reading-out operation. FIG. 14 is a timing chart showing the data reading-out sequence of the example shown in FIG. 11 and FIG. 15 is a timing chart showing voltage of each wire in the period of the time points t0 to t3 in FIG. 14.

As shown in FIG. 14, the reading-out of the data is performed in order from the page PG0 to the last page PG575.

First, by selecting the word line WL0, the data is read out in order from the pages PG0 to PG11. At that time, as shown in FIG. 15, the potential of the selected word line WL0 is constant as the voltage VSLCV, and the potential of the non-selected word lines WL1 to WL47 is constant as the voltage VREAD. In this state, the selection gate lines SGD0 to SGD11 and SGS0 to SGS11 are selected in order. In the period of the reading-out of the pages PG0 to PG11, the potential of the signal line CG0 corresponding to the selected word line WL0 is constant as the voltage VSLCV, and the potential of the signal lines CG corresponding to the non-selected word lines WL1 to WL47 is constant as the voltage VREAD.

After that, at the time point t4, the word line WL1 is selected. In this state, the selection gate lines SGD0 to SGD11 and SGS0 to SGS11 are selected in order in the same manner as described above. Accordingly, the data of the pages PG12 to PG23 is read out in order. In the period of the reading-out of the pages PG12 to PG23, the potential of the signal line CG1 corresponding to the selected word line WL1 is constant as the voltage VSLCV, and the potential of the signal lines CG corresponding to the non-selected word lines WL0 and WL2 to WL47 is constant as the voltage VREAD. After that, the data of pages PG24 to PG575 is read out in the same manner as described above.

In the period of the reading-out operation described above (period of reading-out of the PG0 to PG575), the voltage VRDEC is constant as the voltage VREADH.

In addition, also when performing the reading-out, the selection gate line SGS of the non-selected string may be turned to the "H" level.

1.3 Effects According to the Embodiment

By using the configuration according to the first embodiment, the operation speed of the NAND type flash memory 1 can be improved. The effects will be described below.

In the three-dimensionally laminated NAND type flash memory described in the embodiment, as a page increment system, in a state where any word line is selected in advance, the strings (memory group GP) are selected in order. By using this system, in a case of the NAND type flash memory of a single level cell (SLC) system in which each of the memory cell transistors MT holds one bit data, the lower address is allocated in the string address (address for designating the memory group, that is, selection gate line), and the upper address can be allocated in the word line address. Accordingly, the allocation of the address can be performed extremely easily.

Figure 16:
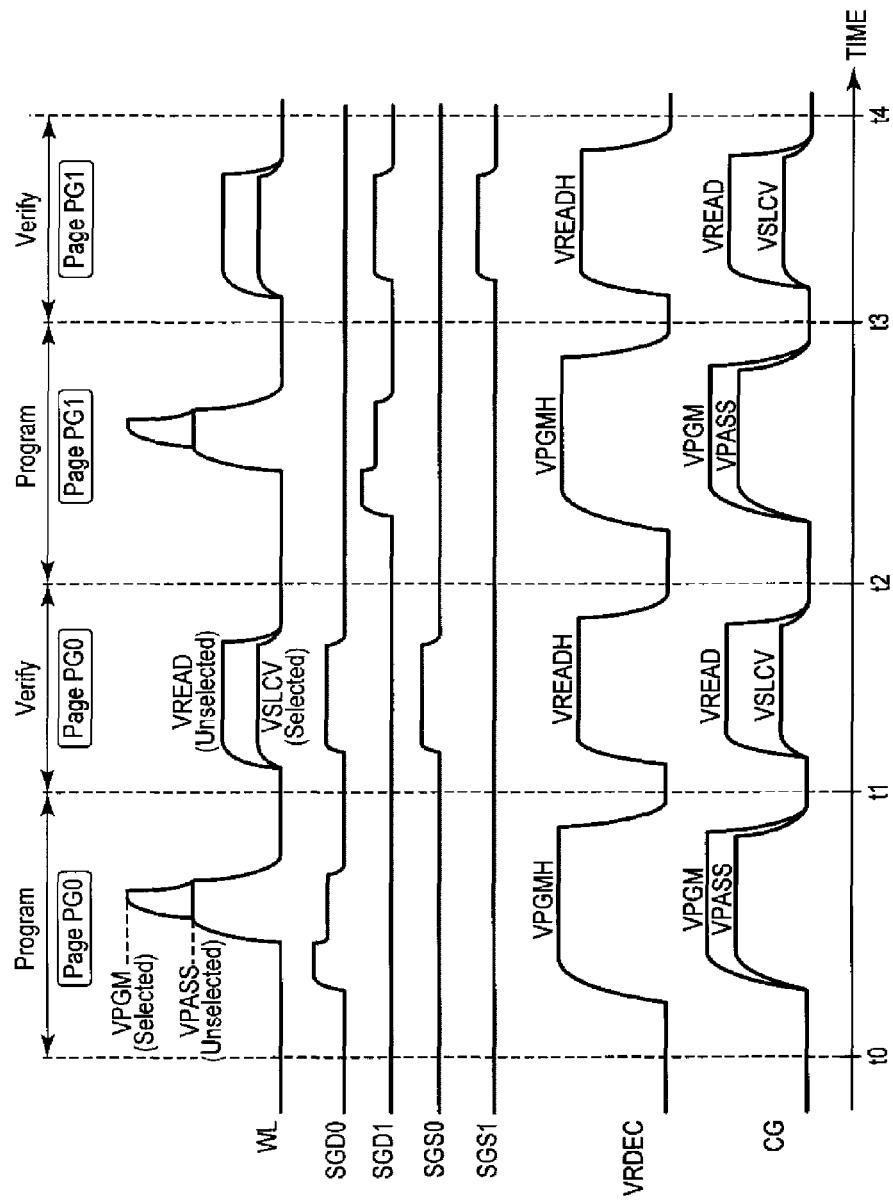
FIG. 16 is a timing chart of various signals at the time of data writing according to a comparative example.

As the writing sequence of the data in a case of such address allocation, a method as shown in FIG. 16 is considered. FIG. 16 is a timing chart showing voltage of each wire at the time of the data writing sequence according to a comparative example.

As shown in the drawing, in the comparative example, the programming and verification are repeated for each page. Accordingly, in comparative example, the word line needs to be driven for each operation. However, in the three-dimensionally laminated NAND type flash memory described in FIGS. 1 to 4, since the plurality of word lines are laminated, the capacity of the word line per unit length is large, compared to the NAND type flash memory in which the memory cells are arranged in two-dimensionally. Accordingly, in the method of FIG. 16, there is a consideration in that the operation speed is decreased or is degraded in a viewpoint of consumption current.

However, by using the configuration according to the embodiment, the problems are solved, the operation speed is improved, and the consumption current can be decreased. That is, in the embodiment, as described in FIG. 12, for example, the programming is performed with respect to two pages consecutively, and that, the verification is performed with respect to the two pages consecutively. During the period of the consecutive operation, the selected word line is not changed, and only the selection gate line is changed. Accordingly, it is possible to avoid the waiting time for word line stabilization which occupies a large portion of the period of the verification operation (for example, see the period of t2 to t4 in FIG. 13).

In addition, in the programming operation and the verification operation, in the period of the consecutive operation, it is possible to have the voltage VRDEC and the potential of the signal line CG to constant (for example, see the period of t0 to t2 and the period of t2 to t4 in FIG. 13). In particular, the voltage VRDEC, such as voltage VPGMH and VREADH, is very large and a long time is necessary for charging. In comparative example shown in FIG. 16, the voltage VRDEC and the potential of the signal line CG are necessary to be changed for each operation. However, in this embodiment, they are not necessary. Accordingly, the operation speed can be improved and the consumption current can be decreased.

In addition, the effects of avoiding the word line stabilization waiting time at the time of the verification is also obtained at the time of the reading-out, in the same manner. As described in FIG. 15, in the same block, when reading out the data from the plurality of pages with different strings (memory group GP) and the same related word lines, the potential of the word line is maintained to be constant and only the selection gate line may be changed.

In addition, in the embodiment, the SLC type NAND type flash memory is used as an example. In the device such as solid state drive (SSD), it is common to write most of the data are written first to the flash memory with the SLC system. Accordingly, by applying the embodiment to such device, the effects such as speeding-up or the like become significant.

2. Second Embodiment

Next, the semiconductor memory device according to the second embodiment will be described. In this embodiment, the number of the consecutively programming and verifying pages in the first embodiment is changed to three pages, not two pages. Hereinafter, only the points different from the first embodiment will be described.

2.1 Configuration of NAND Type Flash Memory

In the configuration of the NAND type flash memory 1 according to the embodiment, the number of the latch circuits which hold the data latch 14 in the first embodiment is increased from two to three. In more detail, in the configuration shown in FIG. 9, a third latch circuit is added in the data latch 14. Accordingly, the data latch 14 can hold the data of 3 bits per one bit line BL.

2.2 Data Writing Sequence

Next, the data writing operation according to the embodiment will be described. As described above, in the flow of the data writing of the embodiment, the number of pages in Steps S21 and S22 in FIG. 10 described in the first embodiment is increased from two pages to three pages.

Figure 17:
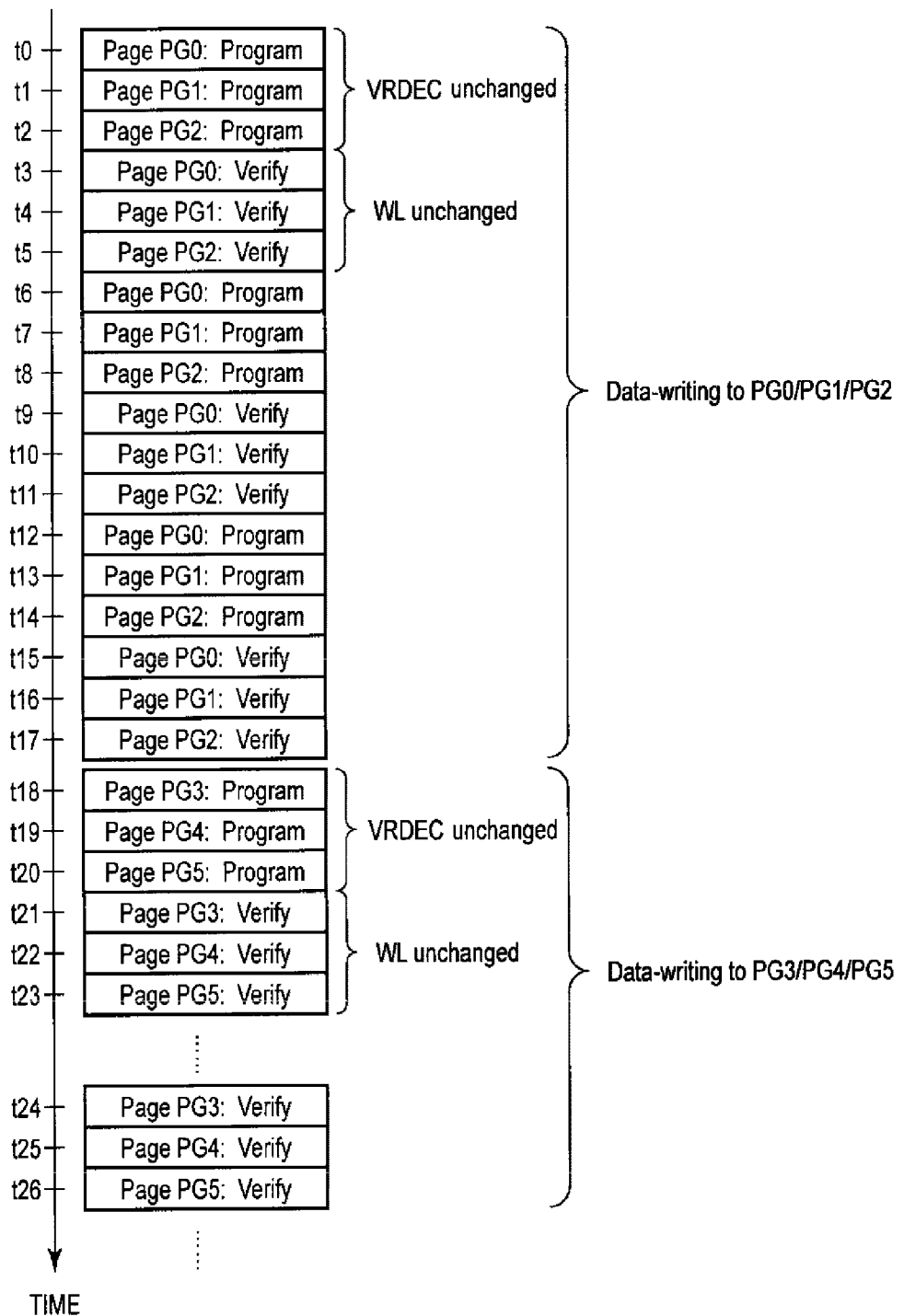
FIG. 17 is a timing chart of a data writing method according to a second embodiment.
Figure 18:
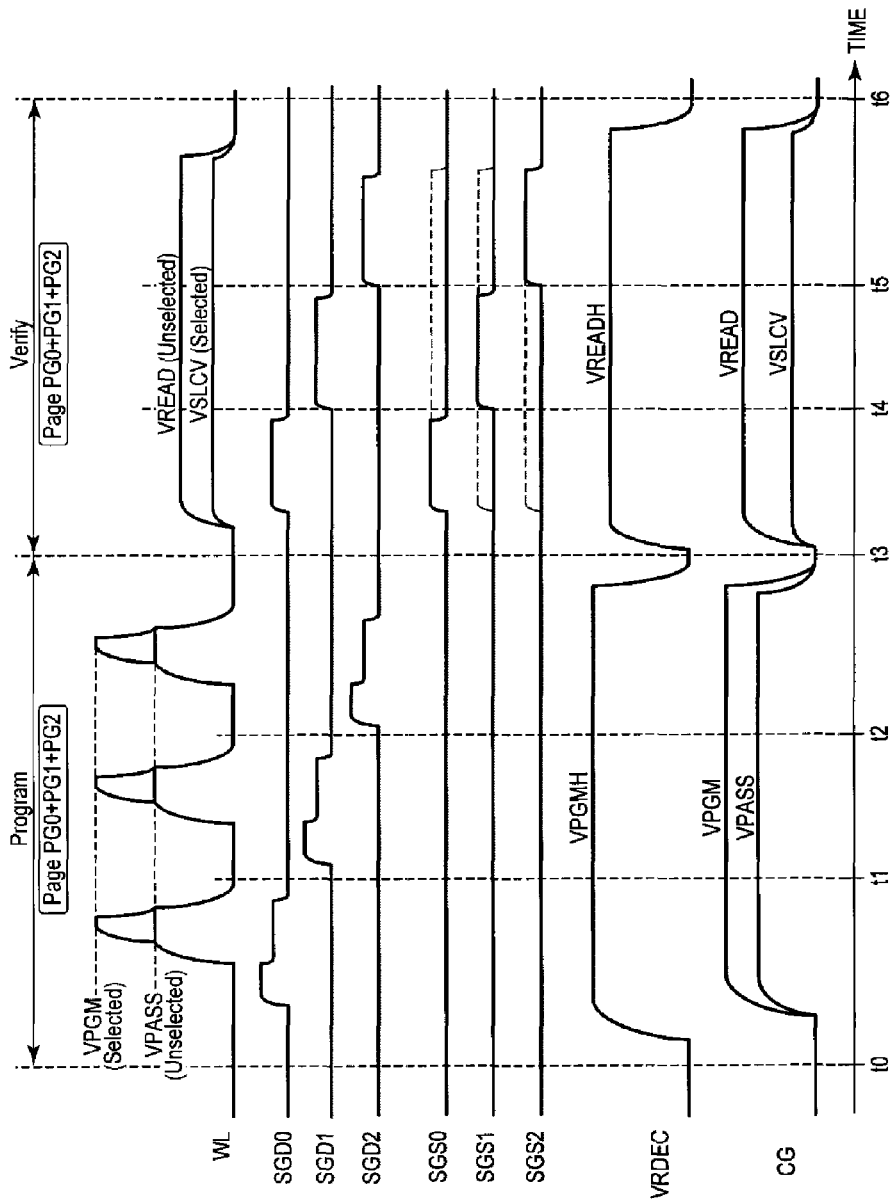
FIG. 18 is a timing chart of various signals at the time of data writing according to a second embodiment.

The detailed example of the writing sequence will be described referring to FIGS. 17 and 18. FIG. 17 is a timing chart showing the data writing sequence according to the embodiment, FIG. 18 is a timing chart showing the voltage of each wire in the period of time points t0 to t6 of FIG. 17.

As shown in FIG. 17, first, in the time points t0 to t2, the data is programmed consecutively on the pages PG0 to PG3. In more detail, as shown in FIG. 18, in a state where the selection gate line SGD0 is selected, the voltage VPGM is applied to the selected word line WL0, and then, in a state where the selection gate line SGD1 is selected, the voltage VPGM is applied to the selected word line WL0. Then, in a state where the selection gate line SGD2 is selected, the voltage VPGM is applied to the selected word line WL0. In this process, the voltage VRDEC is constant as the voltage VPGMH. In addition, the potential of the signal line CG0 corresponding to the selected word line WL0 is constant as the voltage VPGM, and the potential of the signal line CG1 to CG47 corresponding to the non-selected word line WL1 to WL47 is constant as the voltage VPASS.

Next, in the time points t3 to t5 of FIG. 17, the data of the pages PG0 to PG2 is consecutively verified. In more detail, as shown in FIG. 18, in a state where the voltage VSLCV is applied to the selected wire line WL0, the selection gate lines SGD0 to SGD2 and SGS0 to SGS2 are selected in order. In this process, the voltage VRDEC is constant as the voltage VREADH. In addition, the potential of the signal line CG0 corresponding to the selected wire line WL0 is constant as the voltage VSLCV, and the potential of the signal lines CG1 to CG47 corresponding to the non-selected wire lines WL1 to WL47 is constant as the voltage VREAD.

By repeating the operations described above, the data to the last page PG575 is written in a unit of three pages.

Since the reading-out sequence is same as that of the first embodiment, the description thereof is omitted.

2.3 Effects According to the Embodiment

When using the configuration according to the embodiment, the word line voltage stabilization waiting time can be further reduced, compared to the first embodiment, and the number of times the voltage VRDEC and the potential of the signal line CG are changed can be reduced.

Accordingly, it is possible to further achieve the speeding-up of the operations and reduction of the consumption current, compared to the first embodiment.

In addition, in the embodiment, the case where the number of pages for consecutively programming and verifying was three pages was described as the example. However, this depends on the number of the latch circuits in the data latch 14, and when using the SLC system, the programming and verification can be performed consecutively for the number of the latch circuits. That is, the programming and the verification can be consecutively performed for the number of bits of data which can be held by the data latch 14 for each bit line BL. For example, if the number of the latch circuits is four, the programming and verification can be consecutively performed on four pages. This is the same as a case of five or more latch circuits.

3. Third Embodiment

Next, the semiconductor memory device according to the third embodiment will be described. In the embodiment, the first embodiment is applied to the multi-level cell (MLC) system NAND type flash memory. Hereinafter, only the points different from the first embodiment will be described.

3.1 Configuration of NAND Type Flash Memory

Figure 19:
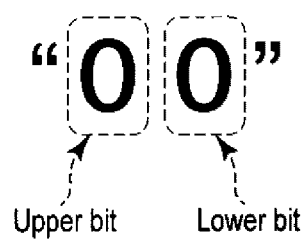
FIG. 19 is a conceptual diagram showing page allocation with respect to 2-bit data.

The NAND type flash memory 1 according to the embodiment is as shown in FIGS. 1 to 9 described in the first embodiment. One aspect that is different from the first embodiment is that, each of the memory cell transistors MT holds at least four threshold values, and the four types of data items can be determined by the four threshold values. That is, as shown in FIG. 19, each of the memory cell transistors MT can hold 2-bit data (4-value data). "00" is used as an example in FIG. 19, however, additionally, data of "01", "10", and "11" can be held. Herein, as shown in FIG. 19, each of two bits is defined as an upper bit and a lower bit, and the writing of the data will be described below with a case of performing from the lower bit, as an example. In addition, in the same manner as the case of the SLC system, also in a case of the MLC system, a plurality of lower-bit data items are collectively written (or read out), and a plurality of upper-bit data items are collectively written (read out). They are called a lower page and an upper page, respectively.

3.2 Sequence of Data Writing

Figure 20:
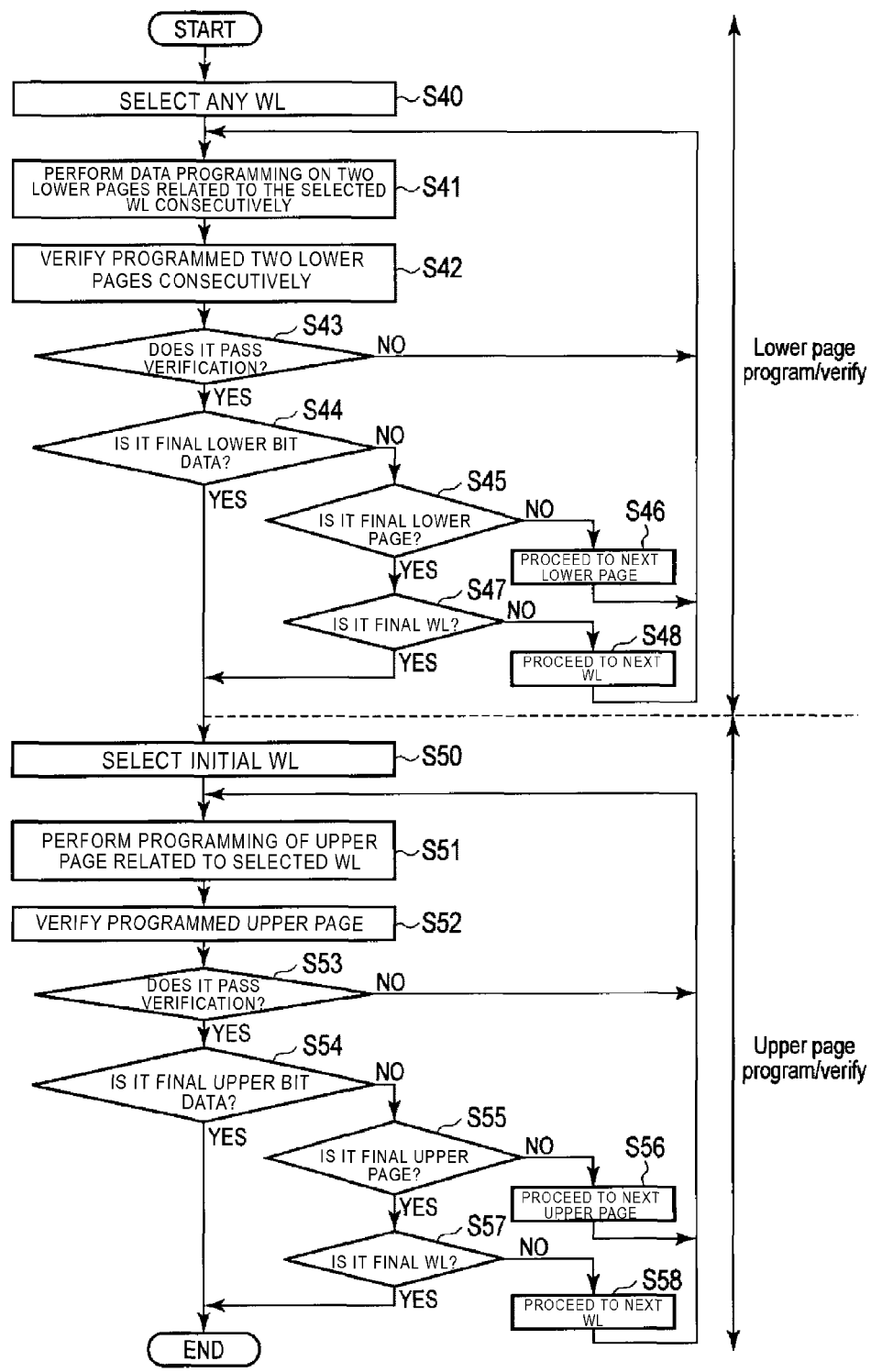
FIG. 20 is a flowchart of a data writing method according to a third embodiment.

Next, the details of the writing operation will be described referring to FIG. 20. FIG. 20 is a flowchart showing the writing operation. As described above, the writing operation is broadly the combination of the data writing of the lower page and the data writing of the upper page. Each operation is substantially the same as the operation described in FIG. 10 in the first embodiment.

As shown in FIG. 20, first, the writing of the lower page data is performed. That is, the row decoder 11 selects any of word lines WL (Step S40). Then, the data is consecutively programmed on the two lower pages related to the selected word line WL (Step S41). That is, for example, first, the data is programmed on any of the lower pages in the memory group GP0, and the data is programmed on any of the lower page in the subsequent memory group GP1 (this page shares the selected word line with the lower page immediately programmed in the memory group GP0).

Next, the lower-bit data of the consecutively programmed two pages is consecutively verified (Step S42). If the written data fails the verification (Step S43, NO), the process returns to Step S41 and the programming is repeated. If the written data passes the verification (Step S43, YES), the lower-bit data remaining which was to be written is checked. If there is no remaining data (Step S44, YES), the writing of the lower page data is completed.

When there is remaining lower-bit data which was to be written (Step S44, NO), and the page written and verified in Steps S41 and S42 is not the last page among the lower pages related to the word line selected in Step S40 (Step S45, NO), next page is selected and the process returns to Step S41. In a case of the last page (Step S45, YES), next word line is selected (Step S47, NO, Step S48), and the process returns to Step S41.

As described above, if the writing of the lower-bit data is completed, the upper bit-data is written. That is, the row decoder 11 selects the word line WL initially selected in Step S40 when performing the lower page writing (Step S50). The data is programmed on the upper page related to the selected word line WL (Step S51). Next, the upper-page data which is programmed in Step S51 is verified (Step S52). In Steps S51 and S52, the process is performed in a unit of one page, unlike Steps S41 and S42. In Step S53, if the written data fails the verification (Step S53, NO), the process returns to Step S51 and the programming is repeated. If the written data passes the verification (step S53, YES), the upper-bit data remaining which was to be written is checked. If there is no remaining data (Step S54, YES), the writing operation of the data is completed.

When there is remaining upper-bit data which was to be written (Step S54, NO), and the page written and verified in Steps S51 and S52 is not the last page among the upper pages related to the word line selected in Step S50 (Step S55, NO), next page is selected and the process returns to Step S51. In a case of the last page (Step S55, YES), next word line is selected (Step S57, NO, Step S58), and the process returns to Step S51.

As described above, in the embodiment, when writing the lower-bit data, the programming is consecutively performed with respect to two pages in the same manner as the first embodiment, and the verification is consecutively performed with respect to the two pages. This combination is repeated until the data passes the verification. Then if the data passes the verification, the same process is executed with respect to next two pages.

With respect to this, when writing the upper-bit data, the programming and verification are executed for each page.

Figure 21:
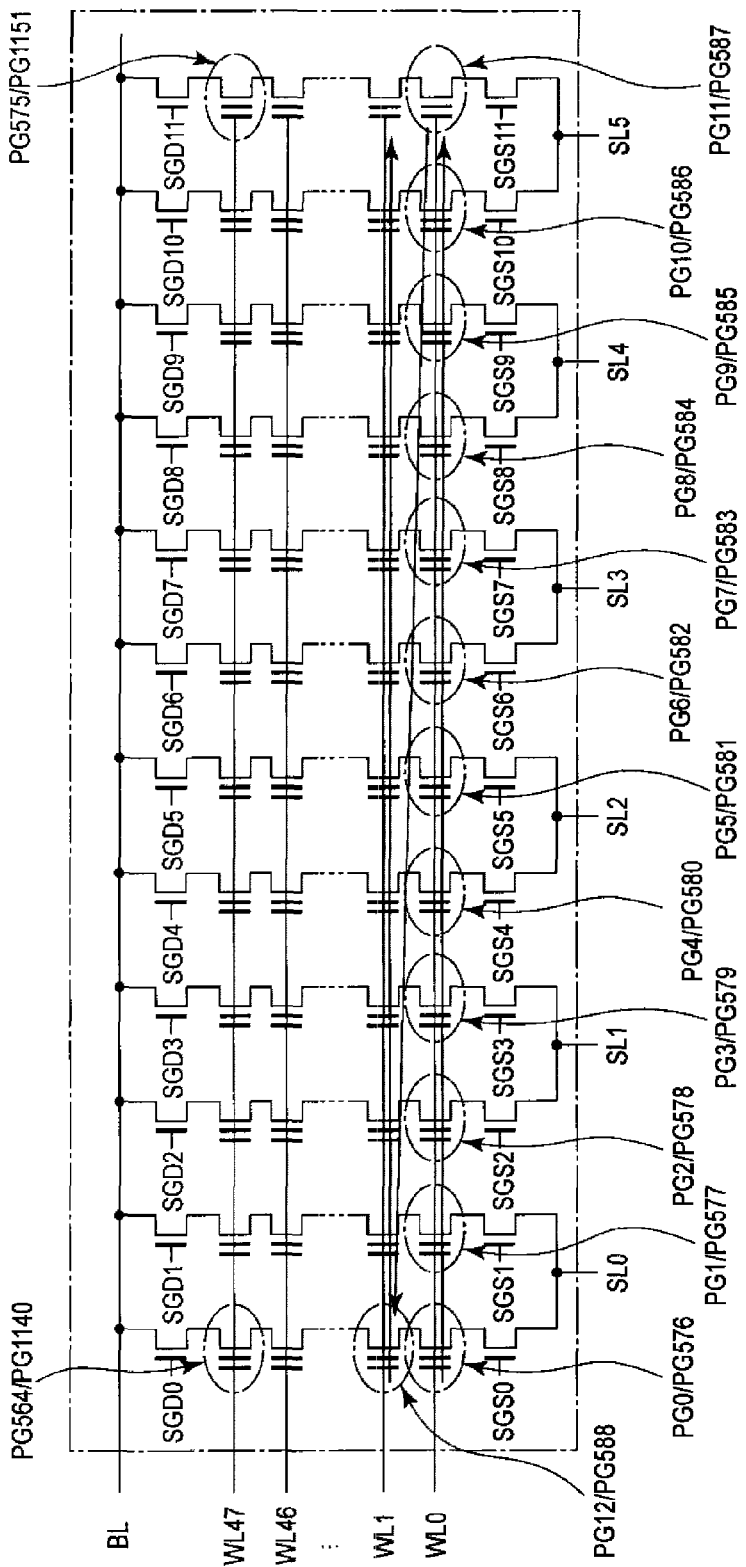
FIG. 21 is a circuit diagram of a memory cell array according to a third embodiment.

The detailed example will be described with the memory cell array 10 shown in FIG. 21 as an example. FIG. 21 shows strings connected to one bit line BL, in the arbitrary block BLK, and is corresponded with FIG. 11 described in the first embodiment. However, in FIG. 21, each memory cell holds two-bit data.

As shown in the drawing, two pages of the upper page and the lower page are related to each word line WL of each memory group GP. Hereinafter, as an example, the pages PG0 to PG575 described in the first embodiment corresponds to the lower pages, and the upper pages with respect to these pages are called pages PG576 to PG1151.

That is, in each of the NAND strings (memory groups GP0 to GP11) connected to the selection gate lines SGD0 to SGD11, the grouping of the lower bits of the memory cells connected to the word line WL0 is called pages PG0 to PG11, respectively. In the same manner, in each of the NAND strings (memory groups GP0 to GP11) connected to the selection gate lines SGD0 to SGD11, the grouping of the lower bits of the memory cells connected to the word line WL1 is called pages PG12 to PG23, respectively. Accordingly, in each of the NAND strings (memory groups GP0 to GP11) connected to the selection gate lines SGD0 to SGD11, the grouping of the lower bits of the memory cells connected to the last word line WL47 is called pages PG564 to PG575, respectively.

In addition, in each of the NAND strings connected to the selection gate lines SGD0 to SGD11, the grouping of the upper bits of the memory cells connected to the word line WL0 is called pages PG576 to PG587, respectively. In the same manner, in each of the NAND strings connected to the selection gate lines SGD0 to SGD11, the grouping of the upper bits of the memory cells connected to the word line WL1 is called pages PG588 to PG599, respectively. Accordingly, in each of the NAND strings (memory groups GP0 to GP11) connected to the selection gate lines SGD0 to SGD11, the grouping of the upper bits of the memory cells connected to the last word line WL47 is called pages PG1140 to PG1151, respectively.

Figure 22:
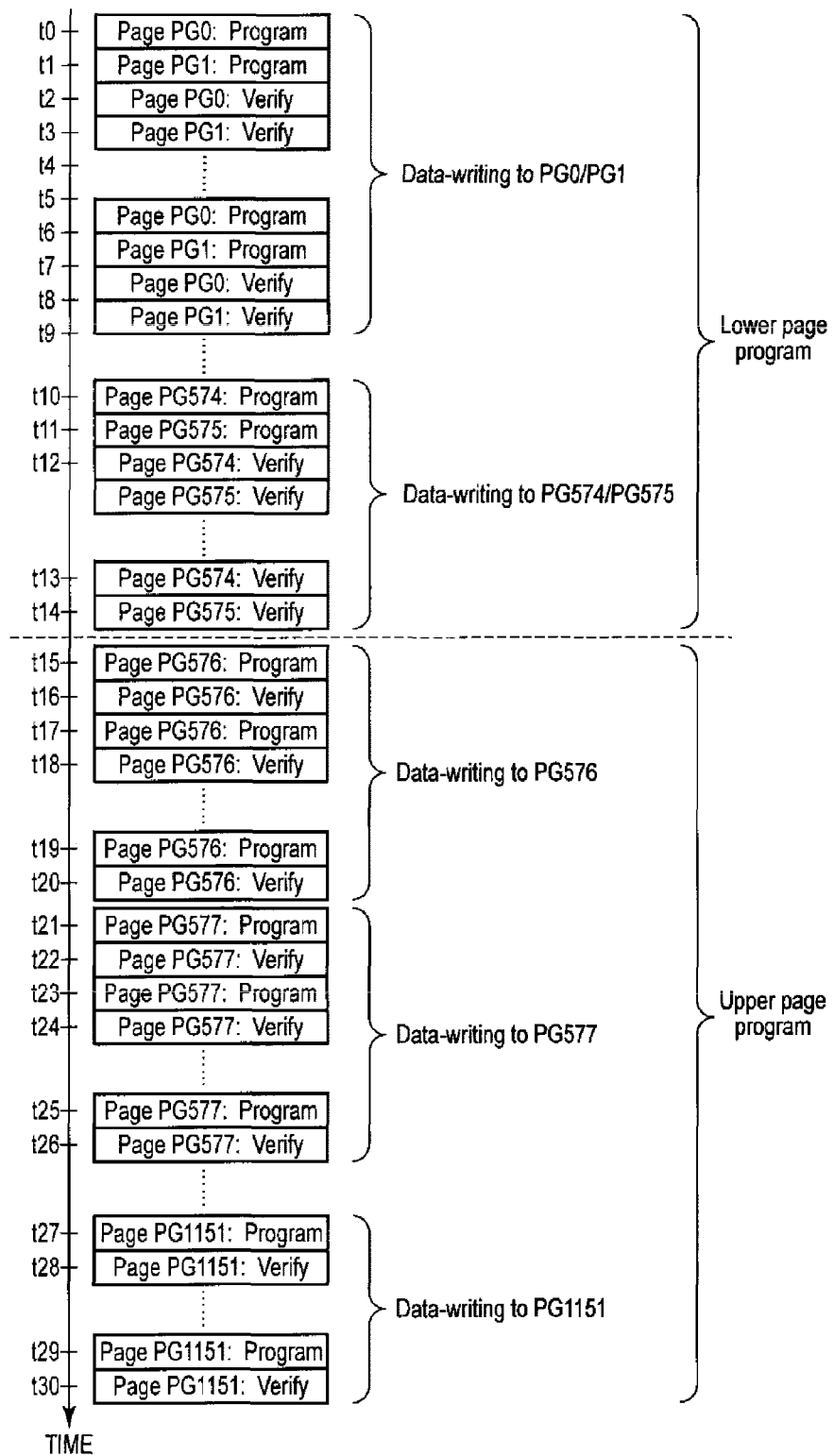
FIG. 22 is a timing chart of a data writing method according to a third embodiment.

FIG. 22 is a timing chart showing the data writing sequence of the memory cell array 10 shown in FIG. 21.

As shown in the drawing, first, the lower-page data (PG0 to PG575) is written in the time points t0 to t14, and then, the upper-page data (PG576 to PG1151) is written in the time points t15 to t30. When writing the lower-page data, in the same manner as described in the first embodiment, the two pages are consecutively programmed and verified. On the other hand, when writing the upper-page data, the programming and verification are performed for each page.

Figure 23:
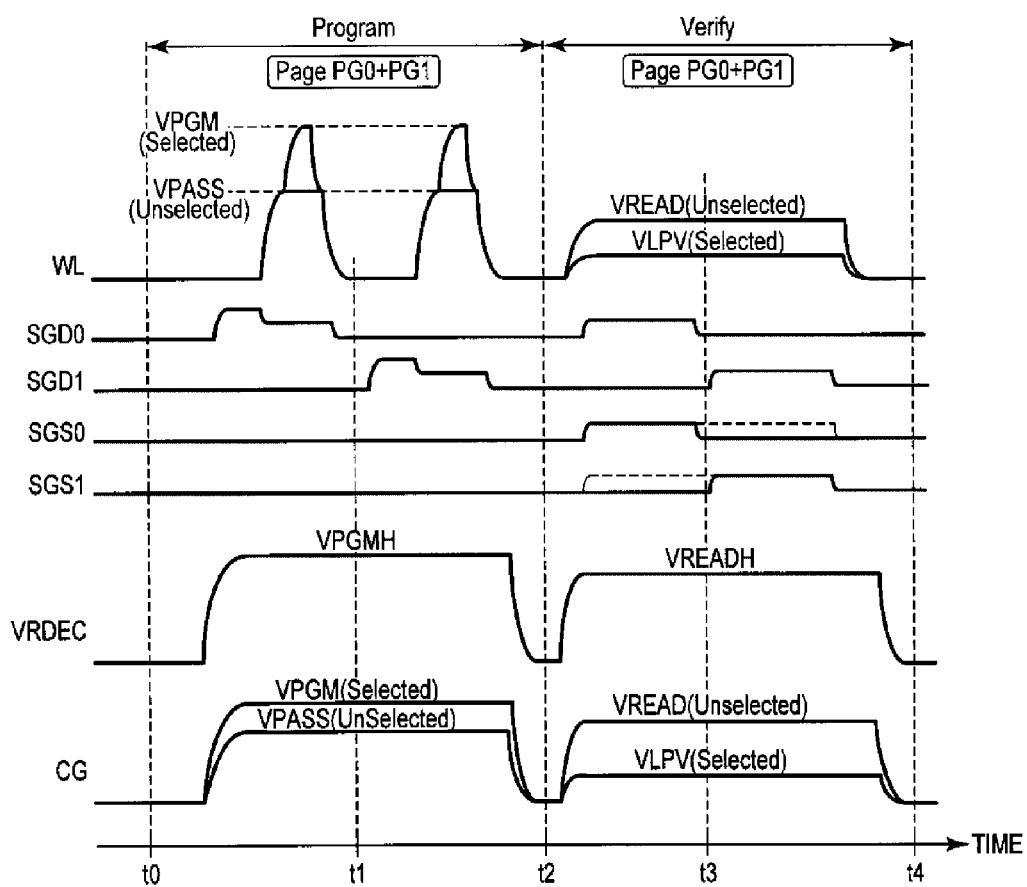
FIG. 23 is a timing chart of various signals at the time of data writing according to a third embodiment.
Figure 24:
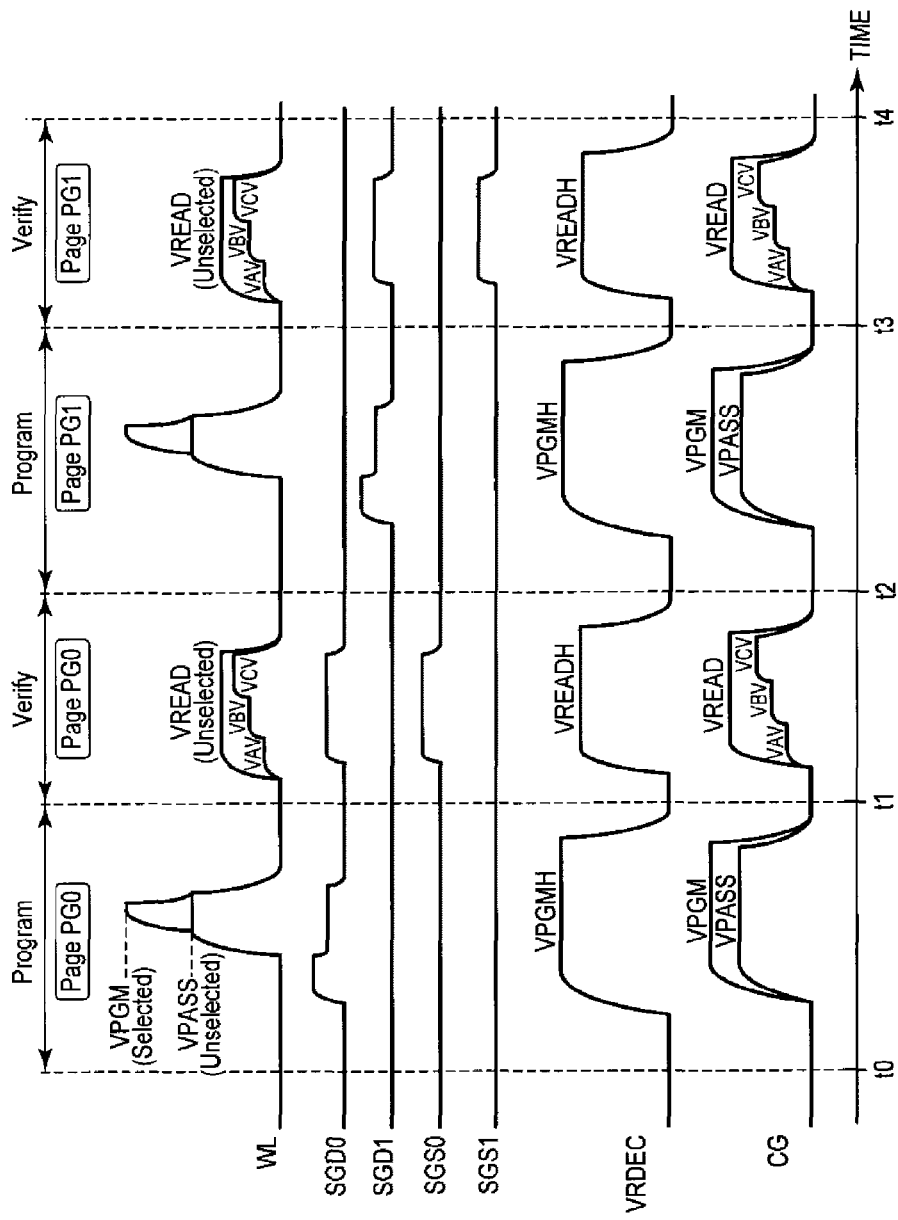
FIG. 24 is a timing chart of various signals at the time of data writing according to a third embodiment.

FIGS. 23 and 24 are timing charts showing the potential change of each wire at the time of the writing, FIG. 23 shows the case of the lower page data writing, and FIG. 24 shows the case of the upper page data writing.

As shown in FIG. 23, the aspect at the time of the lower-page data writing is the same as that of FIG. 13 described in the first embodiment. However, the verification level is different from that of FIG. 13, and the voltage VLPV is applied to the selected word line. When the threshold voltage which can be obtained by the memory cell transistor is set to a "EP" level, an "A" level, a "B" level, and a "C" level in order from the lower level, the voltage between the "EP" level and the "A" level is set to VAV, the voltage between the "A" level and the "B" level is set to VBV, and the voltage between the "B" level and the "C" level is set to VCV, the voltage VLPV is voltage between VA and VB, for example.

As shown in FIG. 24, the aspect at the time of the upper-page data writing is substantially the same as that of FIG. 16, for example. However, when performing the verification, VAV, VBV, and VCV are filed order to the selected word line.

3.3 Effects According to the Embodiment

According to the embodiment, the method described in the first embodiment can also be applied with respect to the MLC system NAND type flash memory in which each memory cell holds two-bit data.

In addition, in the embodiment, the case where each memory cell holds two-bit data was described as an example. Of course, the example may be extended to the case of holding the data with 3 or more bits (8-value or higher).

In addition, in the embodiment, the writing of the upper-bit data is performed for each page. This is because the number of the latch circuits in the data latch 14 is two (the first latch circuit 160 and the second latch circuit 161) per each bit line. In the writing of the upper-bit data, not only the upper-bit data itself, but also the lower-bit data is also necessary. This is because, even when the upper bits are the same, for example, if the lower bits are different, the threshold values for setting target are different. This lower-bit data is generally held in the latch circuit of the data latch 14.

By doing so, in the case of the embodiment, any one of the first latch circuit 160 and the second latch circuit 161 holds the upper bits and the other one holds the lower bits. Accordingly, the data latch 14 can only hold the data for one page when performing the upper bit writing. Accordingly, in the embodiment, the writing on the upper page is performed for one page.

Of course, if the number of the latch circuits in the data latch 14 is increased, the writing can also be performed for two pages, or in a unit of more than two pages, for the upper bit. For example, when the data latch 14 includes four latch circuits, that is, when the data latch 14 can hold the data of four bits per one bit line, the lower bit can be written in a unit of four pages, and the upper bit can be written in a unit of two pages.

In addition, the bit allocation described in FIG. 19 is only an example. That is, it is arbitrary to define any of the two bits as the upper and lower, and among the upper bit and the lower bit, it is arbitrary as to which one to write first. When performing the writing from the upper bit first, in the description of the embodiment described above, the "upper" and the "lower" may be switched.

4. Modification Example

As described above, the semiconductor memory device 1 according to the embodiment includes the plurality of memory cells which are laminated on a semiconductor substrate, and include charge storage layers and control gates, the plurality of word lines which commonly connect the control gates of the plurality of memory cells, and the control unit which performs programming and verification of data in a page unit, with respect to the memory cells (circuit blocks 11 to 16 in FIG. 1). The control unit consecutively performs programming with respect to the plurality of pages related to the same word line (period of t0 to t1 in FIGS. 12 to 13), and further consecutively performs verification with respect to the plurality of pages (period of t2 to t3 in FIGS. 12 to 13).

According to the configuration, the programming and verification can be consecutively performed with respect to the plurality of pages. Accordingly, the time for waiting the stabilization of the voltage of the word line can be reduced and the operation speed of the NAND type flash memory can be improved.

In addition, the embodiment is not limited to the embodiment described above, and various modifications can be performed. For example, in the examples of FIGS. 12, 14, and 17, the case where the data is written or read out from the page PG0 was used as an example, however, of course, from which page the writing or the reading-out starts is different depending on the page address to be received from the host device or the controller. In addition, the embodiment was described with the three-dimensionally laminated type NAND type flash memory as an example of the semiconductor memory device. The detailed configuration of the three-dimensionally laminated type NAND type flash memory is not particularly limited, and the configuration in that the memory cell array shown in FIG. 2 can be realized, may be used, for example. For example, the current path of the NAND string may be in a U shape or may be in a shape of one column. In a case of having a columnar shape, the transistors BT are unnecessary. In addition, the embodiment is not limited to the three-dimensionally laminated type, and the embodiment can also be applied to the conventional NAND type flash memory in which the memory cells are two-dimensionally arranged in the plane of the semiconductor substrate. In addition, in the embodiment, the case of erasing the data in a block BLK unit was described as an example, however, the embodiment is not limited thereto, and the data may be erased in a unit of the plurality of NAND strings 17, for example.

Figure 25:
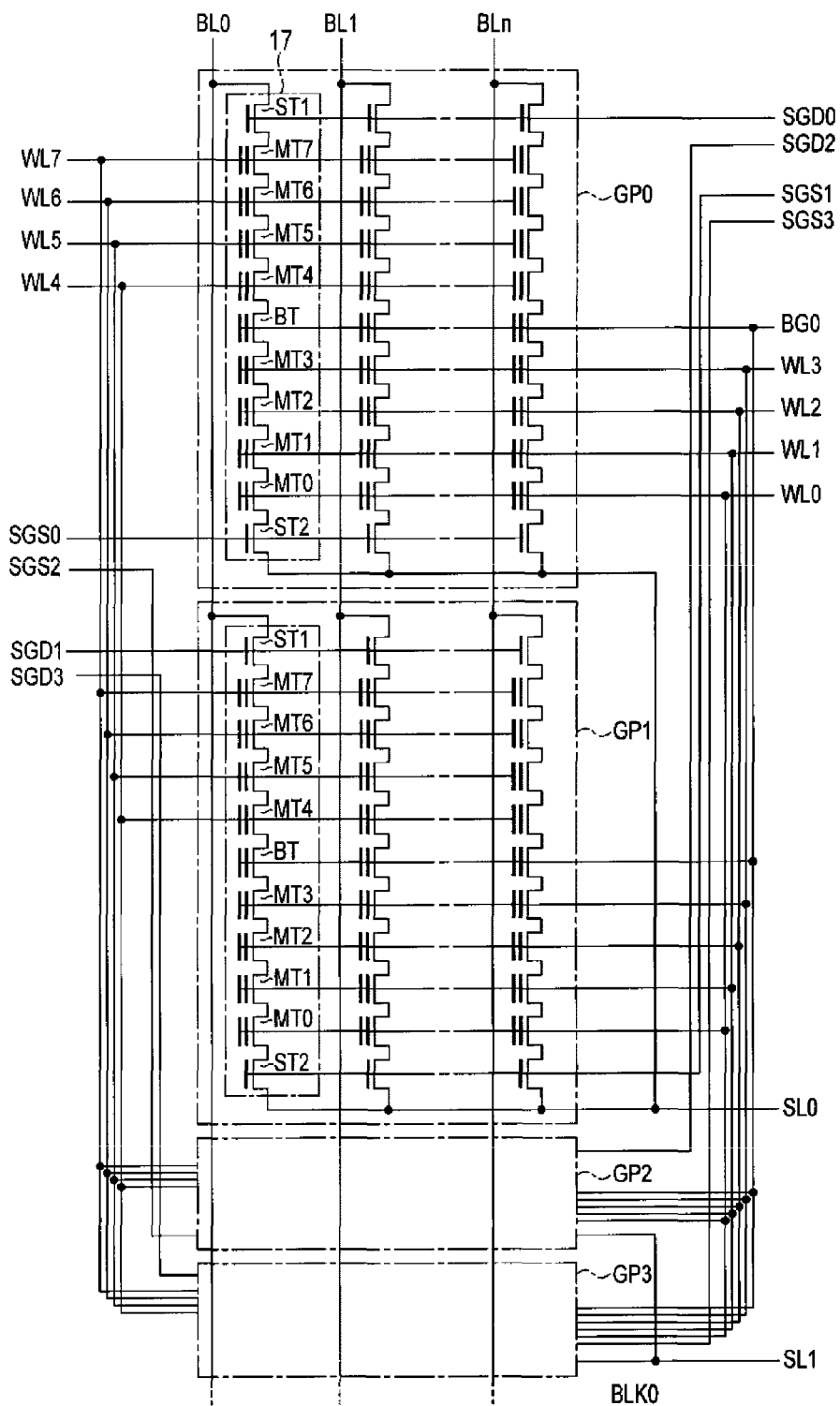
FIG. 25 is a circuit diagram of a memory cell array according to a modification example of first to third embodiments.

In addition, the memory cell array shown in FIG. 2 may have the configuration shown in FIG. 25. FIG. 25 is a circuit diagram of the block BLK0, and the other blocks BLK1 to BLK3 also have the same configuration. As shown in the drawing, the word lines WL0 to WL3, the back gate line BG, the even-numbered selection gate lines SGD0 and SGD2, and the odd-numbered selection gate lines SGS1 and SGS3 are extracted to one end side of the memory cell array 10. With respect to this, the word lines WL4 to WL7, the even-numbered selection gate lines SGS0 and SGS2, and the odd-numbered selection gate lines SGD1 and SGD3 are extracted to the other end side of the memory cell array which is the opposite side to the one end side. The memory cell array may have such a configuration. In the configuration, the row decoder 11 may be divided into two row decoders, for example, and may be arranged so as to face to each other with the memory cell array 10 interposed therebetween. The selection gate lines SGD0, SGD2, SGS1, and SGS3, and word lines WL0 to WL3, and the back gate line BG may be selected by one row decoder, and the selection gate lines SGS0, SGS2, SGD1, and SGD3, and word lines WL4 to WL7 may be selected by the other row decoder. According to the configuration, the congestion of the wires of the selection gate lines and the word lines in the area between the driver circuit 12 and the memory cell array 10 (including the row decoder 11) can be alleviated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a block of memory cells, the memory cells of the block being erasable as a unit, the block including a first memory string and a second memory string, the first memory string including a first selection transistor and a plurality of first memory cells which are stacked above a semiconductor substrate, the second memory string including a second selection transistor and a plurality of second memory cells which are stacked above the semiconductor substrate;
   a plurality of word lines, each of which is commonly connected to control gates of one of the first memory cells and one of the second memory cells; and
   a control unit configured to perform programming and verification of data in the memory cells,
   wherein the control unit is configured to consecutively perform programming of data in a first page that includes one of the first memory cells and a second page that is connected to the same word line as the first page and includes one of the second memory cells, by turning on the first selection transistor and turning off the second selection transistor when programming data in the first page and then turning on the second selection transistor and turning off the first selection transistor when programming data in the second page, and then to consecutively perform verification of data in said first and second pages of the memory cells.

2. The semiconductor memory device according to claim 1, wherein the control unit is configured to consecutively perform programming of data in at least three pages of the memory cells connected to the same word line, and then consecutively perform verification of data in said at least three pages of the memory cells connected to the same word line.

3. The semiconductor memory device according to claim 1, further comprising:
   a plurality of blocks each including a plurality of the memory cells,
   wherein each of the blocks includes a plurality of memory groups each including a plurality of memory strings in each of which a plurality of memory cells are connected in series, and the plurality of memory groups in the same block share the same plurality of word lines, and
   wherein the first page of memory cells is part of a first memory group and the second page of memory cells is part of a second memory group.

4. The semiconductor memory device according to claim 3, further comprising:
   a plurality of bit lines each connected in common to one of the memory strings in the first memory group and one of the memory strings in the second memory group; and
   a plurality of source lines each connected in common to all of the memory strings in at least two memory groups.

5. The semiconductor memory device according to claim 4, wherein each of the memory strings includes two selection transistors, such that the memory cells of each of the memory strings are connected in series between the two selection transistors, connected to a corresponding bit line through one of the two selection transistors and commonly connected to one of the source lines through the other of the two selection transistors, and
   the gates of one of the two selection transistors in each memory group are connected in common to a first selection gate line and the gates of the other of the two selection transistors in each memory group are connected in common to a second selection gate line.

6. The semiconductor memory device according to claim 5, wherein the programming is consecutively performed by applying a selection voltage to the first selection gate line of a first memory group and then applying the selection voltage to the first selection gate line of a second memory group, while keeping a block selection voltage at a constant level and a control gate voltage of a selected word line at a constant level.

7. The semiconductor memory device according to claim 5, wherein the verification is consecutively performed by applying a selection voltage to the first and second selection gate lines of the first memory group and then applying the selection voltage to the first and second selection gate lines of the second memory group, while keeping a block selection voltage at a constant level and a control gate voltage of a selected word line at a constant level.

8. The semiconductor memory device according to claim 1, wherein
each of the memory cells is configured to hold data of two or more bits, and
the control unit is configured to consecutively perform the programming of the first bit of data in at least two pages of the memory cells and then consecutively perform the verification of the first bit of data in said at least two pages of the memory cells, and to perform the programming and verification of the second bit of data, which is different from the first bit of data, one page of memory cells at a time.

9. The semiconductor memory device according to claim 8, wherein the control unit is configured to perform the programming and the verification for the second bit after performing the programming and the verification for the first bit.

10. A data writing method of a semiconductor memory device which includes a block of memory cells, the memory cells of the block being erasable as a unit, the block including a first memory string and a second memory string, the first memory string including a first selection transistor and a plurality of first memory cells that are stacked above a semiconductor substrate, the second memory string including a second selection transistor and a plurality of second memory cells which are stacked above the semiconductor substrate, the semiconductor memory device further including a plurality of word lines including a first word line connected to one of the first memory cells that makes up a part of a first page, and one of the second memory cells that makes up a part of a second page, the method including:
programming a first data into the first page by turning on the first selection transistor, turning off the second selection transistor, and selecting the first word line;
programming a second data into the second page by turning on the second selection transistor, turning off the first selection transistor, and maintaining the first word line in a selected state, after the programming of the first page and prior to verifying the programming of the first page; and
verifying the programming of the first page and then the second page by selecting the first word line, after the programming of the second page.

11. The data writing method according to claim 10, wherein during a period for verifying the programming of the first and second pages, a potential of the first word line is maintained in a selected state.

12. The data writing method according to claim 10, wherein during a period for verifying the programming of the first and second pages, a control gate voltage supplied to the first word line is kept constant.

13. The data writing method according to claim 10, wherein during a period for programming the first and second pages, a control gate voltage supplied to the first word line is kept constant.

14. The data writing method according to claim 13, wherein during a period for programming the first and second pages, a control gate voltage supplied to other word lines is kept constant.

15. A semiconductor memory device comprising:
memory cells arranged in blocks, each block containing multiple groups, including first and second groups, and each group containing multiple strings, each string including a plurality of the memory cells connected in series, the memory cells in each block being erasable as a unit and the strings including a first string in the first group and a second string in the second group, wherein the first string includes a first selection transistor and a plurality of first memory cells, and the second memory string includes a second selection transistor and a plurality of second memory cells;
a plurality of word lines, each of which is connected to a control gate of one memory cell from each of the multiple strings, each of the word lines being shared across different groups; and
a control unit configured to program memory cells of a first group and then memory cells of a second group consecutively and then verify the programming of the memory cells of the first group and then the memory cells of the second group consecutively,
wherein the control unit is configured to consecutively perform programming of data in a first page that includes one of the first memory cells and a second page that is connected to the same word line as the first page and includes one of the second memory cells, by turning on the first selection transistor and turning off the second selection transistor when programming data in the first page and then turning on the second selection transistor and turning off the first selection transistor when programming data in the second page, and then to consecutively perform verification of data in said first and second pages of the memory cells.

16. The semiconductor memory device according to claim 15, wherein
each of the strings includes two selection transistors, the gates of one of the two selection transistors in each group are connected in common to a first selection gate line and the gates of the other of the two selection transistors in each group are connected in common to a second selection gate line, and
the control unit is configured to program the memory cells of the first and second groups consecutively by selecting the word line connected in common to the memory cells of the first and second groups, selecting the first selection gate line of the first group, and then selecting the first selection gate line of the second group.

17. The semiconductor memory device according to claim 16, wherein during a period for consecutively programming the memory cells of the first and second groups, a control gate voltage supplied to the word line connected in common to the memory cells of the first and second groups, is kept constant.

18. The semiconductor memory device according to claim 15, wherein
each of the strings includes two selection transistors, the gates of one of the two selection transistors in each group are connected in common to the same selection gate line and the gates of the second selection transistors in each group are connected in common to the same selection gate line, and the control unit is configured to verify the programming of the memory cells of the first and second groups consecutively by selecting the word line connected in common to the memory cells of the first and second groups, selecting the first and second selection gate lines of the first group, and then selecting the first and second selection gate lines of the second group.

19. The semiconductor memory device according to claim 18, wherein during a period for consecutively verifying the memory cells of the first and second groups, a control gate voltage supplied to the word line connected in common to the memory cells of the first and second groups, is kept constant.

* * * * *